US010976361B2

(12) United States Patent
Malisic et al.

(10) Patent No.: US 10,976,361 B2
(45) Date of Patent: Apr. 13, 2021

(54) AUTOMATED TEST EQUIPMENT (ATE) SUPPORT FRAMEWORK FOR SOLID STATE DEVICE (SSD) ODD SECTOR SIZES AND PROTECTION MODES

(71) Applicant: Advantest Corporation, Tokyo (JP)

(72) Inventors: Srdjan Malisic, San Jose, CA (US); Michael Jones, San Jose, CA (US); Chi Yuan, San Jose, CA (US)

(73) Assignee: Advantest Corporation, Tokyo (JP)

( * ) Notice: Subject to any disclaimer, the term of this patent is extended or adjusted under 35 U.S.C. 154(b) by 172 days.

(21) Appl. No.: 16/227,389

(22) Filed: Dec. 20, 2018

(65) Prior Publication Data

US 2020/0200819 A1 Jun. 25, 2020

(51) Int. Cl.
*G01R 31/28* (2006.01)
*G01R 1/02* (2006.01)

(52) U.S. Cl.
CPC ......... *G01R 31/2834* (2013.01); *G01R 1/025* (2013.01)

(58) Field of Classification Search
CPC .......... G01R 31/2834; G01R 31/31908; G01R 31/31907; G01R 1/025; G11C 2029/5602; G11C 29/56
USPC .................................................... 324/750.01
See application file for complete search history.

(56) References Cited

U.S. PATENT DOCUMENTS 5,497,378 A 3/1996 Amini et al.
5,805,571 A 9/1998 Zwan et al.
6,026,230 A 2/2000 Lin et al.
6,069,873 A 5/2000 Pugaczewski et al.
6,357,023 B1 3/2002 Co et al.
(Continued)

FOREIGN PATENT DOCUMENTS

CN 101120262 2/2008
CN 101313366 11/2008
(Continued)

OTHER PUBLICATIONS

Thirunavukkarasu, V., et al., "Performance of Low Power BISTArchitecture for UART," International Conference on Communication and Signal Processing, Date of Conference: Apr. 6-8, 2016, India, pp. 2290-2293. (Year: 2016).
(Continued)

*Primary Examiner* — Christopher P McAndrew

(57) ABSTRACT

An automated test equipment (ATE) apparatus comprises a computer system comprising a system controller, wherein the system controller is communicatively coupled to a tester processor and an FPGA. The tester processor is operable to generate commands and data from instructions received from the system controller for coordinating testing of a device under test (DUT), wherein the DUT supports a plurality of non-standard sector sizes and a plurality of protection modes. The FPGA is communicatively coupled to the tester processor, wherein the FPGA comprises at least one hardware accelerator circuit operable to internally generate commands and data transparently from the tester processor for testing the DUT, and wherein the at least one hardware accelerator circuit is able to perform computations to calculate protection information associated with the plurality of protection modes and to generate repeatable test patterns sized to fit each of the plurality of non-standard sector sizes.

23 Claims, 13 Drawing Sheets

(56) References Cited

U.S. PATENT DOCUMENTS

| | | |
|---|---|---|
| 6,429,029 B1 | 8/2002 | Eldridge et al. |
| 6,551,844 B1 | 4/2003 | Eldridge et al. |
| 6,681,351 B1 | 1/2004 | Kittross et al. |
| 6,757,845 B2 | 6/2004 | Bruce |
| 6,904,375 B1 | 6/2005 | Sabih et al. |
| 7,181,360 B1 | 2/2007 | Nikolac et al. |
| 7,269,805 B1 | 9/2007 | Ansari et al. |
| 7,343,558 B2 | 3/2008 | Kadota |
| 7,363,188 B1 | 4/2008 | Olgaard et al. |
| 7,555,589 B2 | 6/2009 | Kang |
| 7,590,903 B2 | 9/2009 | Volkerink et al. |
| 7,643,239 B2 * | 1/2010 | Sun .................... G11B 5/59627 |
| | | 360/75 |
| 7,707,468 B2 | 4/2010 | Volkerink et al. |
| 7,772,828 B2 | 8/2010 | Jang et al. |
| 8,127,187 B2 | 2/2012 | Xia et al. |
| 8,161,402 B1 | 4/2012 | Edson et al. |
| 8,269,520 B2 | 9/2012 | Conner |
| 8,545,248 B2 | 10/2013 | Davey et al. |
| 8,564,297 B2 | 10/2013 | Burns et al. |
| 8,581,614 B2 | 11/2013 | Co et al. |
| 8,660,424 B2 | 2/2014 | Achkir et al. |
| 8,718,967 B2 | 5/2014 | Filler et al. |
| 8,842,480 B2 | 9/2014 | Ellis et al. |
| 8,850,267 B2 | 9/2014 | Aggarwal et al. |
| 8,904,247 B2 * | 12/2014 | Toyoda .................... H04L 43/50 |
| | | 714/715 |
| 9,230,046 B2 | 1/2016 | Asaad et al. |
| 9,952,276 B2 | 4/2018 | Frediani et al. |
| 9,989,591 B2 | 6/2018 | Ge et al. |
| 2002/0007025 A1 | 1/2002 | Crowther et al. |
| 2002/0055834 A1 | 5/2002 | Andrade et al. |
| 2002/0163351 A1 | 11/2002 | Koh et al. |
| 2002/0184326 A1 | 12/2002 | Thomson |
| 2003/0191590 A1 | 10/2003 | Narayan et al. |
| 2003/0231741 A1 | 12/2003 | Rancu et al. |
| 2003/0237025 A1 | 12/2003 | Song |
| 2004/0000922 A1 | 1/2004 | Witte |
| 2004/0015739 A1 | 1/2004 | Heinkel et al. |
| 2004/0059536 A1 | 3/2004 | Chang et al. |
| 2004/0168111 A1 | 8/2004 | Arnold et al. |
| 2004/0225465 A1 | 11/2004 | Pramanick et al. |
| 2005/0022088 A1 | 1/2005 | Nakayama |
| 2005/0154550 A1 | 7/2005 | Singh et al. |
| 2005/0159050 A1 | 7/2005 | Hama et al. |
| 2005/0256969 A1 | 11/2005 | Yancey et al. |
| 2005/0262414 A1 | 11/2005 | Elston et al. |
| 2005/0273685 A1 | 12/2005 | Sachdev et al. |
| 2005/0278682 A1 | 12/2005 | Dowling |
| 2006/0132167 A1 | 6/2006 | Chen |
| 2006/0170435 A1 | 8/2006 | Granicher et al. |
| 2006/0195744 A1 | 8/2006 | Petersen |
| 2006/0273809 A1 | 12/2006 | Miller et al. |
| 2007/0168808 A1 | 7/2007 | Ong |
| 2007/0220380 A1 | 9/2007 | Ohanyan |
| 2007/0260955 A1 | 11/2007 | Kliewer |
| 2007/0266288 A1 | 11/2007 | Volkerink et al. |
| 2007/0271059 A1 | 11/2007 | Vonstaudt |
| 2007/0282556 A1 | 12/2007 | Achkar et al. |
| 2008/0015798 A1 | 1/2008 | Bullock et al. |
| 2008/0126899 A1 | 5/2008 | Brennan et al. |
| 2008/0189060 A1 | 8/2008 | Zellner et al. |
| 2008/0204066 A1 | 8/2008 | Jang et al. |
| 2008/0285571 A1 | 11/2008 | Arulambalam et al. |
| 2009/0100304 A1 | 4/2009 | Li et al. |
| 2009/0112548 A1 | 4/2009 | Conner |
| 2009/0113245 A1 | 4/2009 | Conner |
| 2009/0172480 A1 | 7/2009 | Jeddeloh |
| 2009/0212799 A1 | 8/2009 | de la Puente et al. |
| 2009/0282305 A1 | 11/2009 | Chen |
| 2009/0316497 A1 | 12/2009 | Kuroki |
| 2010/0042880 A1 | 2/2010 | Sakai |
| 2010/0107026 A1 | 4/2010 | Nakamura |
| 2010/0157854 A1 | 6/2010 | Anderson et al. |
| 2010/0190451 A1 | 7/2010 | Huber et al. |
| 2010/0312517 A1 | 12/2010 | McNamara et al. |
| 2010/0313071 A1 | 12/2010 | Conner |
| 2011/0050268 A1 | 3/2011 | Co et al. |
| 2011/0072307 A1 | 3/2011 | Hatley et al. |
| 2011/0078525 A1 | 3/2011 | Xia et al. |
| 2011/0098964 A1 | 4/2011 | Mullane et al. |
| 2011/0099424 A1 | 4/2011 | Rivera Trevino et al. |
| 2011/0103235 A1 | 5/2011 | Luong et al. |
| 2011/0112790 A1 | 5/2011 | Lavie et al. |
| 2011/0248737 A1 | 10/2011 | Takeshita et al. |
| 2011/0276302 A1 | 11/2011 | Rivoir |
| 2011/0280091 A1 | 11/2011 | Rooney |
| 2011/0291679 A1 | 12/2011 | Pagani |
| 2011/0298486 A1 | 12/2011 | Co et al. |
| 2012/0079194 A1 | 3/2012 | Lim |
| 2012/0117432 A1 | 5/2012 | Fujisaki |
| 2012/0191400 A1 | 7/2012 | Sontakke et al. |
| 2012/0191402 A1 | 7/2012 | Filler et al. |
| 2013/0013969 A1 | 1/2013 | Rajarao et al. |
| 2013/0015873 A1 | 1/2013 | Suzuki et al. |
| 2013/0055022 A1 | 2/2013 | Chong |
| 2013/0055023 A1 | 2/2013 | Chong et al. |
| 2013/0080503 A1 | 3/2013 | Dean et al. |
| 2013/0111283 A1 | 5/2013 | Zhang |
| 2014/0207402 A1 | 7/2014 | Ferry |
| 2014/0236524 A1 | 8/2014 | Frediani et al. |
| 2014/0236526 A1 * | 8/2014 | Frediani .............. G01R 31/2834 |
| | | 702/119 |
| 2014/0236527 A1 * | 8/2014 | Chan .............. G01R 31/318307 |
| | | 702/119 |
| 2014/0237292 A1 * | 8/2014 | Chan .................... G06F 11/2733 |
| | | 714/32 |
| 2014/0244204 A1 | 8/2014 | Frediani |
| 2015/0028908 A1 | 1/2015 | Kushnick et al. |
| 2015/0253387 A1 | 9/2015 | Gahoi et al. |
| 2015/0370248 A1 * | 12/2015 | Hilliges ........... G05B 19/41875 |
| | | 700/109 |
| 2018/0003764 A1 | 1/2018 | Menon et al. |

FOREIGN PATENT DOCUMENTS

| | | |
|---|---|---|
| CN | 201434049 | 3/2010 |
| CN | 102341717 | 2/2012 |
| CN | 106338679 A | 1/2017 |
| CN | 106569481 A | 4/2017 |
| CN | 106597184 A | 4/2017 |
| EP | 0651261 | 5/1995 |
| JP | 2018060575 | 4/2018 |
| KR | 100778459 | 11/2007 |
| KR | 20090015895 | 2/2009 |
| KR | 20090041528 | 4/2009 |
| KR | 20100073662 | 7/2010 |
| KR | 1020100120692 | 11/2010 |
| KR | 101028594 | 4/2011 |
| KR | 101111482 | 2/2012 |
| KR | 2010026387 | 3/2012 |
| TW | 583534 B | 4/2004 |
| TW | 200900715 A | 1/2009 |
| TW | 200817698 A | 11/2010 |
| TW | I363879 B | 5/2012 |
| TW | 201433802 A | 9/2014 |
| TW | 201837490 A | 10/2018 |
| WO | 2011149725 A2 | 12/2011 |
| WO | 20111150409 | 12/2011 |
| WO | 2012070076 | 5/2012 |
| WO | 20120126087 A1 | 9/2012 |

OTHER PUBLICATIONS

FPGA Wikipedia Entry (http://en.wikipedia.orglwiki/Field-programmable_gate_array).

International Search Report; International Application No. PCTIUS2013/049118; dated Jan. 22, 2014.

Merriam Webster Online Dictionary Definition of "Protocol".

(56) References Cited

OTHER PUBLICATIONS

Medusa Labs Test Tool Suite 7.2; viavisolutions.com; 2016; Viavi Solutions Inc.; 4 pages.

* cited by examiner

| | Data + Metadata (exemplary values) |
|---|---|
| Standard Sector Sizes | 512 + 0 |
| | 4096 + 0 |
| Protection Mode | 512 + 8 |
| | 4096 + 8 |
| Non-standard Odd Sector Size | 520 + 0 |
| | 4104 + 0 |
| | 528 + 0 |
| | 4224 + 0 |

FIG. 12 A

| Guard CRC | Application tag | Reference tag |
|---|---|---|
| 2 bytes | 2 bytes | 4 bytes |
| 1254 | 1256 | 1258 |

Protection Mode

Communicatively Couple a Host Controller to A Tester Processor and an FPGA
1310

Select an Acceleration Mode for Generating Commands and Data for Testing a Plurality of DUTs connected to the FPGA
1312

Determine a Number of Sector Sizes and Protection Modes to be Tested for Each of the Plurality of DUTs
1314

Generate Commands and Data for Testing the Plurality of DUTs for the Supported Sector Sizes and Protection Modes Using the Selected Acceleration Mode
1316

FIG. 13

AUTOMATED TEST EQUIPMENT (ATE) SUPPORT FRAMEWORK FOR SOLID STATE DEVICE (SSD) ODD SECTOR SIZES AND PROTECTION MODES

FIELD OF THE INVENTION

The present disclosure relates generally to the field of electronic device testing systems and more specifically to the field of electronic device testing equipment for testing devices under test (DUTs).

BACKGROUND OF THE INVENTION

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

FIG. 1 is a schematic block diagram of a conventional automatic test equipment body 100 for testing certain typical DUTs e.g. a semiconductor memory device such as a DRAM. The ATE includes an ATE body 100 with hardware bus adapter sockets 110A-110N. Hardware bus adapter cards 110A-110N specific to a particular communication protocol e.g. PCIe, USB, SATA, SAS etc. connect to the hardware bus adapter sockets provided on the ATE body and interface with the DUTs via cables specific to the respective protocol. The ATE body 100 also includes a tester processor 101 with an associated memory 108 to control the hardware components built into the ATE body 100 and to generate the commands and data necessary to communicate with the DUTs being tested through the hardware bus adapter cards. The tester processor 101 communicates with the hardware bus adapter cards over system bus 130. The tester processor may be programmed to include certain functional blocks including a pattern generator 102 and a comparator 106. Alternatively, the pattern generator 102 and comparator 106 may be hardware components mounted on an expansion or adapter card that plug into the ATE body 100.

The ATE body 100 tests the electrical functions of the DUTs 112A-112N connected to the ATE body 100 through hardware bus adapters plugged into the hardware bus adapter sockets of the ATE body 100. Accordingly, the tester processor 101 is programmed to communicate the test programs needed to be run to the DUTs using the protocol unique to the hardware bus adapters. Meanwhile, the other hardware components built into the ATE body 100 communicate signals with each other and with the DUTs according to test programs operating in the tester processor 101.

The test program run by the tester processor 101 may include a function test which involves writing input signals created by the pattern generator 102 to the DUTs, reading out the written signals from the DUTs and using the comparator 106 to compare the output with the expected patterns. If the output does not match the input, the tester processor 101 will identify the DUT as being defective. For example, if the DUT is a memory device such as a DRAM, the test program will write data generated by the pattern generator 102 to the DUT using a Write Operation, read data from the DRAM using a Read Operation and compare the expected bit pattern with the read pattern using the comparator 106.

In conventional systems, the tester processor 101 needs to contain the functional logic blocks to generate the commands and test patterns used in testing the DUTs, such as the pattern generator 102 and the comparator 106, programmed in software directly on the processor. However, in some instances certain functional blocks such as the comparator 106 may be implemented on a field programmable gate array (FPGA), which is an application specific integrated circuit (ASIC) type semiconductor device that can program logic circuits according to a user's demand.

The FPGAs used in conventional systems rely on the tester processor 101 to transfer the commands and test patterns to the FPGA, which the FPGA in turn relays over to the DUTs. Because the tester processor, and not the FPGA, is responsible for generating the commands and test patterns, the number and type of DUTs that can be tested with a given ATE body is limited by the processing capabilities and programming of the tester processor. Where the tester processor generates all the commands and test patterns, bandwidth constraints on the system bus 130 connecting the tester processor to the various hardware components, including any FPGA devices and hardware bus adapter sockets, also places an upper limit on the number of DUTs that can tested simultaneously.

Also, in conventional systems, the communication protocol used to communicate with the DUTs is fixed because the hardware bus adapter cards that plug into the ATE body 100 are single purpose devices that are designed to communicate in only one protocol and cannot be reprogrammed to communicate in a different protocol. For example, an ATE body configured to test PCIe devices will have hardware bus adapter cards plugged into the body that support only the PCIe protocol. In order to test DUTs supporting a different protocol, e.g., SATA the user would ordinarily need to replace the PCIe hardware bus adapter cards with bus adapter cards supporting the SATA protocol. Unless the PCIe hardware bus adapter cards are physically substituted with cards supporting the other protocol, such a system can only test DUTs that support the PCIe protocol. Thus, on the test floor, critical time is consumed replacing hardware bus adapter cards when DUTs running a different protocol from the one that the existing adapter cards support need to be tested.

Another drawback of current tester systems is that the test systems do not presently support testing of DUTs (e.g., SSDs) that support protection modes and odd sector sizes. For example, most of the solid state drives (SSDs) available on the market are formatted for standard sector sizes, e.g., 4K native, 512 native. A 4K native is a drive with sectors that contain 4096 (4K) bytes (4096 logical bytes per sector). A 512 native is a drive with sectors that contain 512 bytes (512 logical bytes per sector). Most modern hard drives use one of the two sector sizes: 512 bytes per sector or 4096 bytes per sector. However, certain vendors also support non-standard sector sizes, e.g., 520 bytes per sector (BPS) or 528 bytes per sector (BPS) especially for drives to be used in enterprise-grade systems. Moreover, certain vendors include additional bytes of metadata in each sector to support parity checking, checksums, and/or cyclic redundancy checksums (CRCs) (e.g., 512+8 BPS where 512 bytes are reserved for data and 8 bytes are reserved for metadata). In other words, the additional metadata included within each sector can enable a protection mode for the SSD. Conventional ATE is limited because it does not support testing of drives that support non-standard sector sizes. Furthermore, conventional ATE also does not support testing of SSDs that enable protection modes, e.g., SSDs that contain additional metadata per sector for supporting parity checking and/or checksums.

BRIEF SUMMARY OF THE INVENTION

Accordingly, a need exists for a tester architecture that can address the problems with the systems described above. What is needed is a test architecture whereby the command and test pattern generation functionality can be transferred onto the FPGA, so that the processing load on the tester processor and the bandwidth requirements on the system bus can be kept at a minimum. This would be more efficient than prior configurations where the tester processor bore the entire processing load and the system bus conveyed test data and commands for all the DUTs connected to the ATE body. Further, what is needed is a test architecture whereby the communicative protocol engine can be programmed on FPGA devices so that the protocol used to communicate with the DUTs is reconfigurable.

In addition, what is needed is a tester system whereby there is support at both the software and the firmware level for testing DUTs (e.g. SSDs) with all combinations of odd sector sizes and all combinations of protection modes. For example, SSDs may have non-standard sector sizes of 520 BPS, 4104 BPS, 528 BPS and 4224 BPS. Furthermore, SSDs may also have an extra 8 or more bytes of metadata per sector to enable certain protection modes. What is needed is a tester system that is able to seamlessly and efficiently test SSDs with non-standard sector sizes and with various protection modes enabled.

In one embodiment, an automated test equipment (ATE) apparatus is presented. The apparatus comprises a computer system comprising a system controller, wherein the system controller is communicatively coupled to a tester processor and an FPGA wherein the system controller is operable to transmit instructions to the tester processor, and wherein the tester processor is operable to generate commands and data from the instructions for coordinating testing of a device under test (DUT). The DUT supports a plurality of odd sector sizes and a plurality of protection modes. The FPGA is communicatively coupled to the tester processor, wherein the FPGA comprises at least one hardware accelerator circuit operable to internally generate commands and data transparently from the tester processor for testing the DUT, and wherein the at least one hardware accelerator circuit is able to perform computations to calculate protection information associated with the plurality of protection modes and to generate repeatable test patterns sized to fit each of the plurality of odd sector sizes. Further, the tester processor is configured to operate in one of a plurality of functional modes, wherein each functional mode is configured to allocate functionality for generating commands and for generating data between the tester processor and the FPGA in a different manner.

In another embodiment, a method for testing using an automated test equipment (ATE) is disclosed. The method comprises transmitting instructions from a system controller of a computer system to a tester processor, wherein the system controller is communicatively coupled to a the tester processor and an FPGA, wherein the tester processor is operable to generate commands and data from the instructions for coordinating testing of a plurality of DUTs, wherein each of the plurality of DUTs supports a plurality of odd sector sizes and a plurality of protection modes. The method further comprises generating commands and data transparently from the tester processor for testing of a plurality of DUTs using a hardware accelerator circuit programmed within an FPGA, wherein the FPGA is communicatively coupled to the tester processor and wherein the hardware accelerator circuit is operable to test the plurality of DUTs, and wherein the hardware accelerator circuit is able to perform computations to calculate protection information associated with the plurality of protection modes and to generate repeatable test patterns sized to fit each of the plurality of odd sector sizes. The method additionally comprises operating the tester processor in one of a plurality of functional modes, wherein each functional mode is configured to allocate functionality for generating commands and for generating data between the tester processor and the FPGA in a different manner.

In another embodiment, a tester is disclosed. The tester comprises a system controller for controlling a test program for testing a plurality of DUTs, wherein each of the plurality of DUTs support a plurality of odd sector sizes and a plurality of protection modes. Further, the tester comprises a primitive comprising a plurality of tester slices, wherein each tester slice comprises a tester processor coupled to communicate with the system controller to receive instructions and data therefrom in accordance with the test program and at least one programmable instantiated tester block coupled to the tester processor, wherein the at least one programmable instantiated tester block is operable to generate test data for application to the plurality of DUTs in a way transparent to the test processor, further operable to receive and compare test data generated by the plurality of DUTs in a way transparent to the tester processor. The instantiated tester block is further yet operable to be programmed to communicate with the plurality of DUTs in a communication protocol compatible with the plurality of DUTs. Additionally, the at least one programmable instantiated tester block comprises a hardware accelerator circuit operable to perform computations to calculate protection information associated with the plurality of protection modes and to generate repeatable test patterns sized to fit each of the plurality of odd sector sizes. The tester also comprises a local memory coupled to the programmable instantiated tester block for storing test data therein and a device interface board for coupling the plurality of tester slices to the plurality of DUTs. Furthermore, each programmable instantiated tester block is operable in one of a plurality of functional modes, wherein each functional mode is configured to allocate functionality for generating commands and for generating data between the tester processor and the programmable instantiated tester block in a different manner.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

FIG. 12A illustrates the various protection modes and odd sector sizes that can be supported by the automated test equipment (ATE) platforms in accordance with an embodiment of the present invention.

FIG. 12B illustrates the information encoded in the metadata for the protection modes supported by various SSDs.

FIG. 13 depicts a flowchart of an exemplary process of testing DUTs supporting non-standard sector sizes and protection modes according to an embodiment of the present invention.

Figure 1:
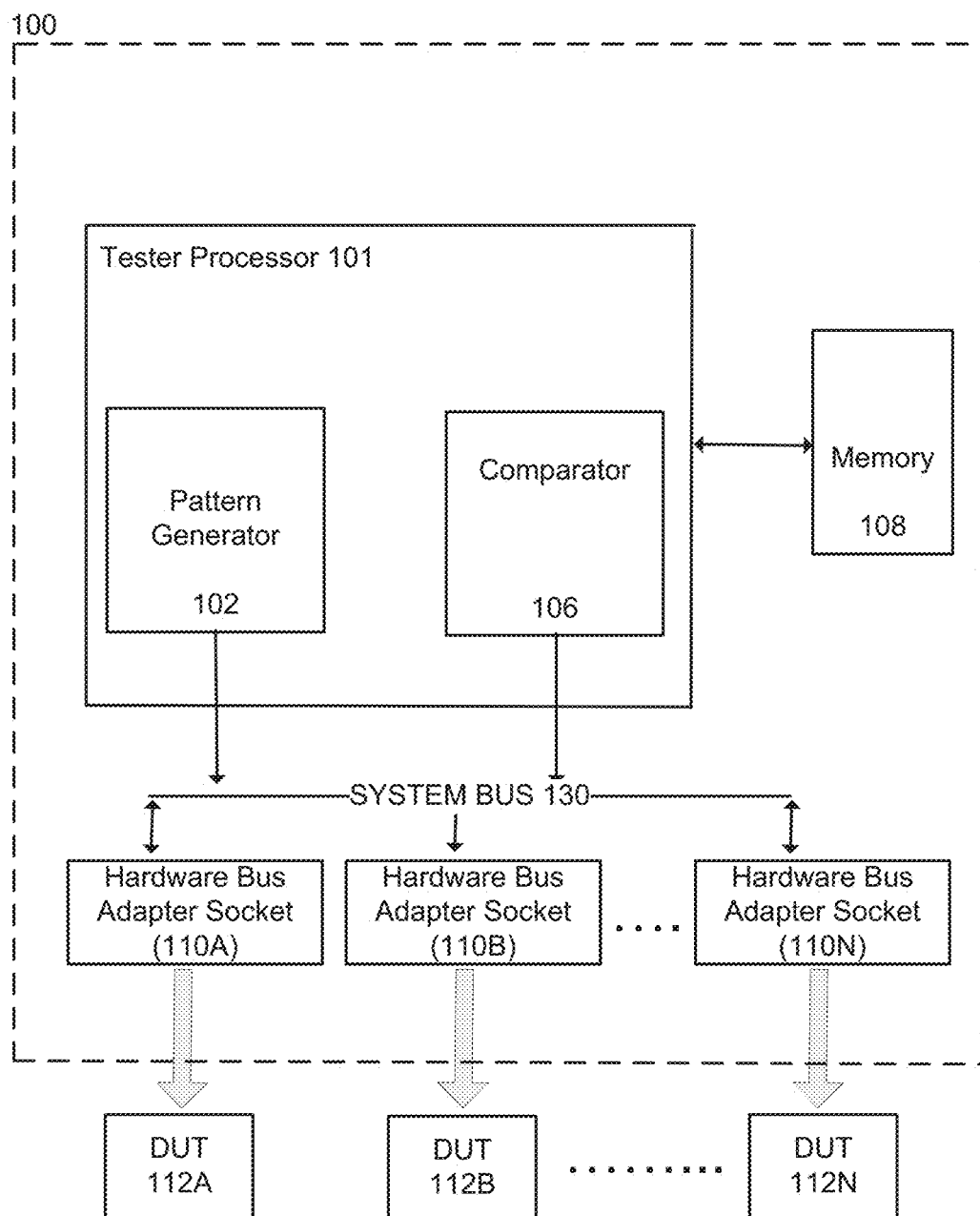
FIG. 1 is a schematic block diagram of a conventional automatic test equipment body for testing a typical device under test (DUT).

In the figures, elements having the same designation have the same or similar function.

DETAILED DESCRIPTION OF THE INVENTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

Notation and Nomenclature Section

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "accessing," "adding," "adjusting," "analyzing," "applying," "assembling," "assigning," "calculating," "capturing," "combining," "comparing," "collecting," "creating," "debugging," "defining," "depicting," "detecting," "determining," "displaying," "establishing," "executing," "generating," "grouping," "identifying," "initiating," "modifying," "monitoring," "moving," "outputting," "performing," "placing," "presenting," "processing," "programming," "querying," "removing," "repeating," "resuming," "sampling," "simulating," "sorting," "storing," "subtracting," "suspending," "tracking," "transforming," "unblocking," "using," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The description below provides a discussion of computers and other devices that may include one or more modules. As used herein, the term "module" or "block" may be understood to refer to software, firmware, hardware, and/or various combinations thereof. It is noted that the blocks and modules are exemplary. The blocks or modules may be combined, integrated, separated, and/or duplicated to support various applications. Also, a function described herein as being performed at a particular module or block may be performed at one or more other modules or blocks and/or by one or more other devices instead of or in addition to the function performed at the described particular module or block. Further, the modules or blocks may be implemented across multiple devices and/or other components local or remote to one another. Additionally, the modules or blocks may be moved from one device and added to another device, and/or may be included in both devices. Any software implementations of the present invention may be tangibly embodied in one or more storage media, such as, for example, a memory device, a floppy disk, a compact disk (CD), a digital versatile disk (DVD), or other devices that may store computer code.

The terminology used herein is for the purpose of describing particular embodiments only and is not intended to limit the scope of the present invention. As used throughout this disclosure, the singular forms "a," "an," and "the" include plural reference unless the context clearly dictates otherwise. Thus, for example, a reference to "a module" includes a plurality of such modules, as well as a single module, and equivalents thereof known to those skilled in the art.

Automated Test Equipment (ATE) Support Framework for Solid State Device (SSD) Odd Sector Sizes and Protection Modes Embodiments of the present invention allow test throughput to be improved by including operating system (OS) support within the tester for testing DUTs (e.g., SSDs) supporting different (odd or non-standard) sector sizes and protection modes without reconfiguring the hardware. More specifically, the calculations and computing required to support odd sector sizes (also known as non-standard sector sizes) and various protection modes may be performed by hardware accelerators implemented on FPGA devices. In other words, computation functionality formerly performed in software on a general-purpose tester processor is transferred to hardware accelerators implemented on FPGA devices. Another way is by increasing the number and types of devices under test (DUTs) that can be tested under prevailing hardware and time constraints, for example, by configuring the hardware so that DUTs supporting many different types of protection modes and sector sizes can be tested with the same hardware without needing to replace or substitute any hardware components. Embodiments of the present invention are directed to so improving test efficiency in the hardware of the automatic test equipment.

Figure 2:
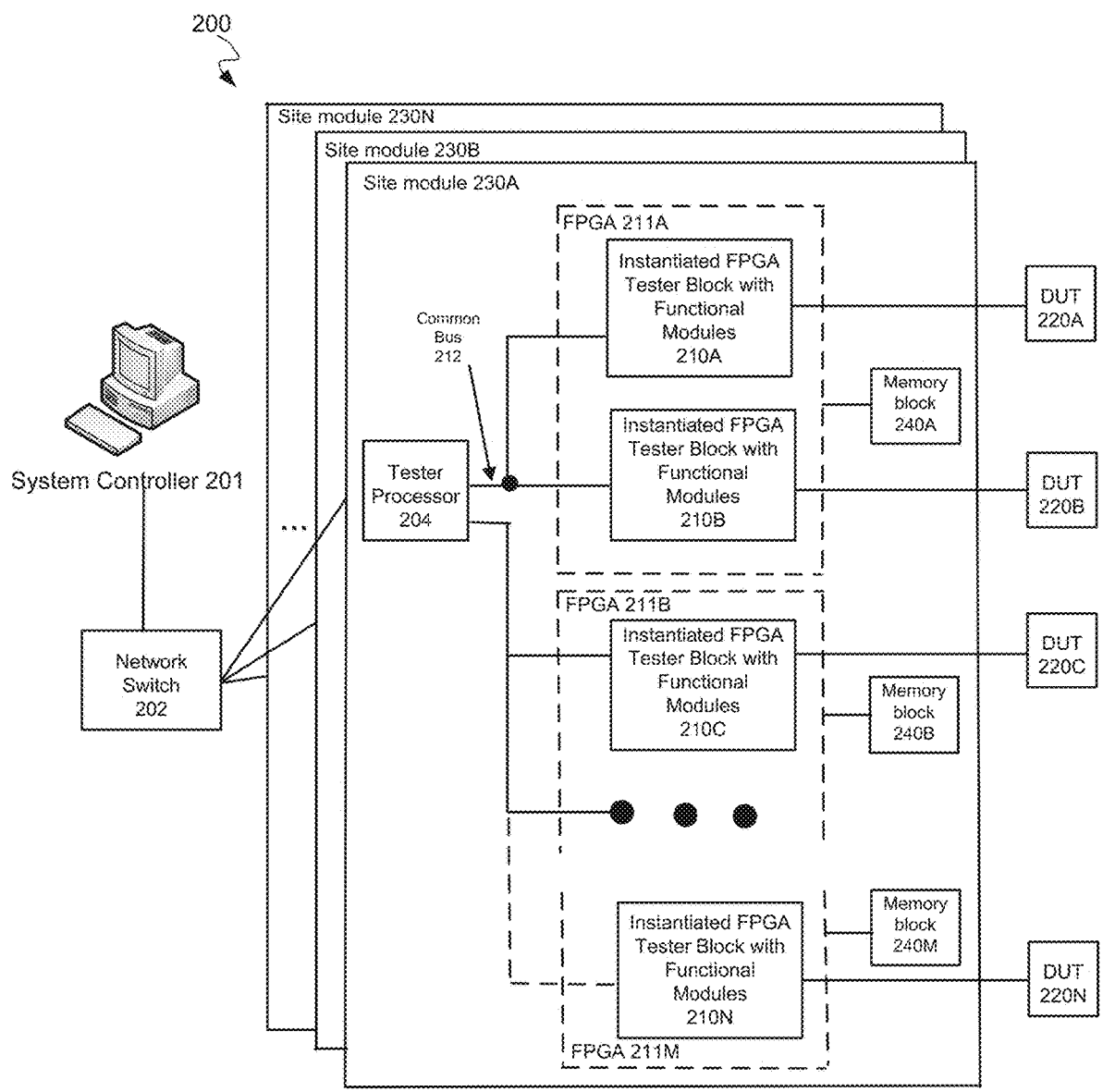
FIG. 2 is a high level schematic block diagram of the interconnections between the system controller, the site modules and the DUTs according to one embodiment of the present invention.
Figure 10:
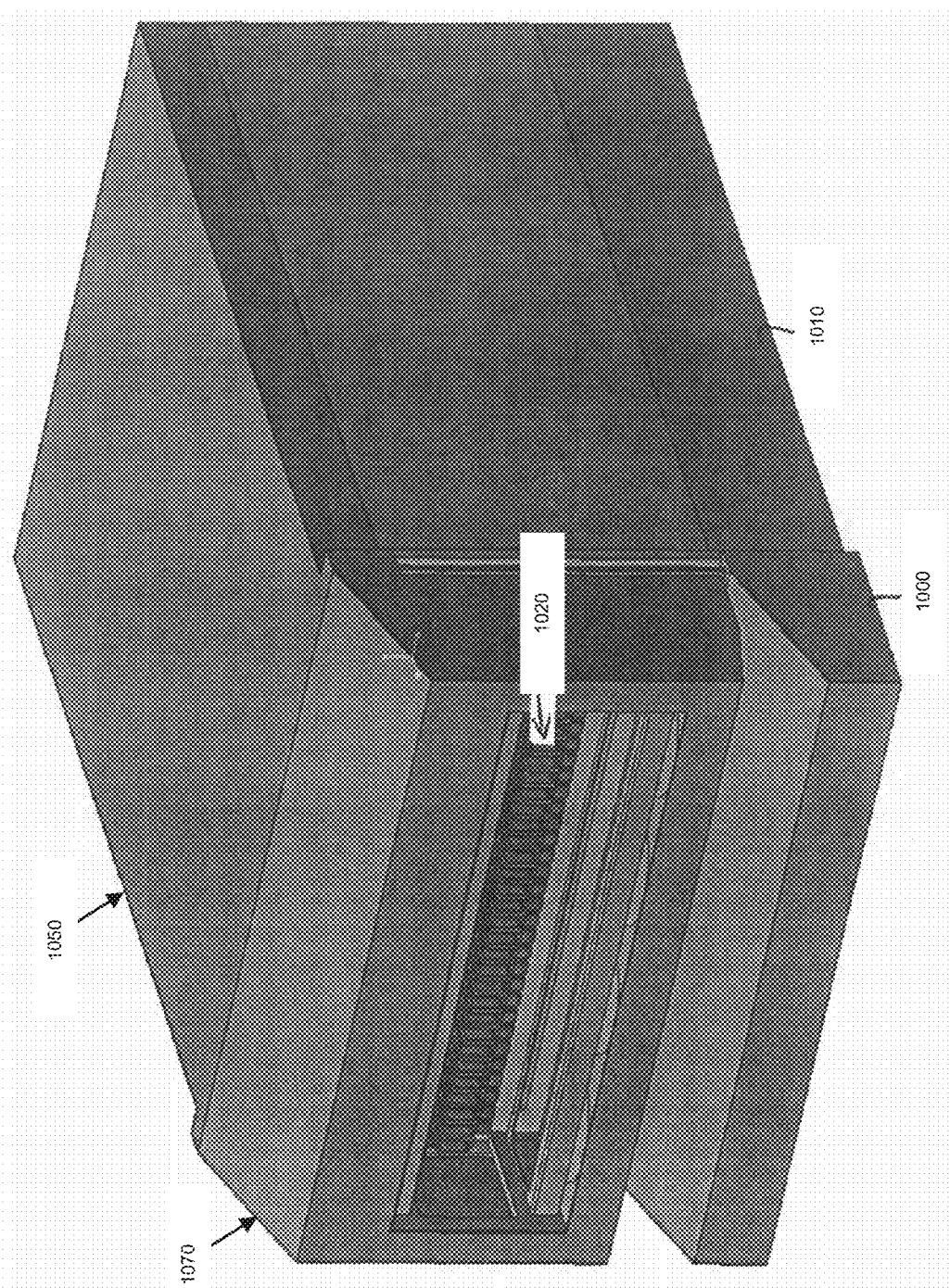
FIG. 10 illustrates a primitive interfaced with a Device Interface Board (DIB) in accordance with an embodiment of the invention.

FIG. 2 is an exemplary high level block diagram of the automatic test equipment (ATE) apparatus 200 in which a tester processor is connected to the devices under test (DUTs) through FPGA devices with built-in functional modules in accordance with an embodiment of the present invention. In one embodiment, ATE apparatus 200 may be implemented within any testing system capable of testing multiple DUTs simultaneously. For example, in one embodiment, apparatus 200 may be implemented inside a primitive as shown in FIG. 10.

Referring to FIG. 2, an ATE apparatus 200 for testing semiconductor devices more efficiently in accordance with an embodiment of the present invention includes a system controller 201, a network switch 202 connecting the system controller to the site module boards 230A-230N, FPGA devices 211A-211M comprising instantiated FPGA tester blocks 210A-210N, memory block modules 240A-240M wherein each of the memory blocks is connected to one of the FPGA devices 211A-211M, and the devices under test (DUTs) 220A-220N, wherein each device under test 220A-220N is connected to one of the instantiated FPGA tester blocks 210A-210N. It should be noted that the DUTs 220A-220N can, in one embodiment, be solid state drives (SSDs). Furthermore, it is possible for a single instantiated FPGA tester block, as shown in FIG. 2, to also be connected to multiple DUTs.

In one embodiment, the system controller 201 may be a computer system, e.g., a personal computer (PC) that provides a user interface for the user of the ATE to load the test programs and run tests for the DUTs connected to the ATE 200. In one embodiment, the system controller 201 may be running the Windows operation system (OS). The Verigy Stylus software executing in the Windows environment is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 512 DUTs.

In one embodiment, the system controller 201 can be connected to the site module boards 230A-230N through a network switch, such as an Ethernet switch. In other embodiments, the network switch may be compatible with a different protocol such as TCP/IP, Fibre Channel, 802.11 or ATM, for instance.

In one embodiment, each of the site module boards 230A-230N may be a separate standalone board used for purposes of evaluation and development that attaches to custom-built load board fixtures, on which the DUTs 220A-220N are loaded, and also to the system controller 201 from where the test programs are received. In other embodiments, the site module boards may be implemented as plug-in expansion cards or as daughter boards that plug into the chassis of the system controller 201 directly. Alternatively, the site module boards may be housed within an enclosure of a primitive (as shown in FIG. 10) and may connect to the various DUTs using a device interface board (DIB).

The site module boards 230A-230N can each comprise at least one tester processor 204 and at least one FPGA device. In one embodiment, the tester processor and its associated memory may be located on a separate board (not shown) affixed to the respective site module. This separate board may be called a Computer On Module (or COM) board. In other words, the FPGA may be located on a separate site module board while the tester processor (with an associated memory) is located on a COM board.

The tester processor 204 and the FPGA devices 211A-211M on the site module board run the test methods for each test case in accordance with the test program instructions received from the system controller 201. In one embodiment the tester processor can be a commercially available Intel x86 CPU or any other well-known processor. Further, the tester processor may be operating on the Ubuntu OS x64 operating system and running the Core Software, which allows it to communicate with the software running on the system controller, to run the test methods. In one embodiment, the tester processor 204 may be an x86 processor running the Linux OS or a modified version of the Linux OS. In one embodiment, the Linux OS running on the tester processor is able to receive commands and data from the Windows OS running on the system controller. The tester processor 204 controls the FPGA devices on the site module and the DUTs connected to the site module based on the test program received from the system controller.

The tester processor 204 is connected to and can communicate with the FPGA devices over bus 212. In one embodiment, tester processor 204 communicates with each of the FPGA devices 211A-211M over a separate dedicated bus. In one embodiment, for example in the standard or bypass mode, tester processor 204 can control the testing of the DUTs 220A-220N transparently through the FPGAs with minimal processing functionality allocated to the FPGA devices. In this embodiment, the data traffic capacity of bus 212 can be exhausted rapidly because all the commands and data generated by the tester processor need to be communicated over the bus to the FPGA devices. In other embodiments, the tester processor 204 can share the processing load by allocating functionality to control the testing of the DUTs to the FPGA devices, e.g., in protocol independent data accelerations (PIDA) or full acceleration (FA)

modes as will be discussed further below. In these embodiments, the traffic over bus 212 is reduced because the FPGA devices can generate their own commands and data.

In one embodiment, each of the FPGA devices 211A-211M is connected to its own dedicated memory block 240A-240M. These memory blocks can, among other things, be utilized to store the test pattern data that is written out to the DUTs. In one embodiment, each of the FPGA devices can comprise two instantiated FPGA tester blocks 210A-210B with functional modules for performing functions including implementation of communicative protocol engines and hardware accelerators as described further herein. Memory blocks 240A-240M can each contain one or more memory modules, wherein each memory module within the memory block can be dedicated to one or more of the instantiated FPGA tester blocks 210A-210B. Accordingly, each of the instantiated FPGA tester blocks 210A-210B can be connected to its own dedicated memory module within memory block 240A. In another embodiment, instantiated FPGA tester blocks 210A and 210B can share one of the memory modules within memory block 240A. In a different embodiment, each FPGA device can have multiple instantiated FPGA tester blocks, each with a respective memory block.

Further, each of the DUTs 220A-220N in the system can be connected to a dedicated instantiated FPGA tester block 210A-210N in a "tester per DUT" configuration, wherein each DUT gets its own tester block. This allows separate test execution for each DUT. The hardware resources in such a configuration are designed in a manner to support individual DUTs with minimal hardware sharing. This configuration also allows many DUTs to be tested in parallel, where each DUT can be connected to its own dedicated FPGA tester block and be running a different test program. In a different embodiment, each instantiated FPGA tester block may also be connected to and configured to test multiple DUTs.

The architecture of the embodiment of the present invention depicted in FIG. 2 has several advantages. First, it eliminates the need for protocol-specific hardware bus adapter sockets and cards in the system because the communication protocol modules can be programmed directly on the instantiated FPGA tester blocks within the FPGA devices. The instantiated tester blocks can be configured to communicate with the DUTs in any protocols that the DUTs support. Accordingly, if DUTs with different protocol support need to be tested, they can be connected to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 201 without any kind of hardware interactions. An FPGA will typically include a configurable interface core (or IP core) that is programmable to provide functionality of one or more protocol based interfaces for a DUT and is programmable to interface with the DUT. For example, the FPGAs 211A-211M in the ATE apparatus 200 will include an interface core that can be configured with the PCIe protocol to test PCIe devices initially and subsequently reconfigured via a software download to test SATA devices. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol.

In another embodiment, the FPGAs 211A-211M can be configured to run more than one communicative protocol, wherein these protocols also can be downloaded from system controller 201 and configured through software. In other words, each FPGA implements custom firmware and software images to implement the functionality of one or more PC based testers in a single chip. The required electrical signaling and protocol-based signaling is provided by on-chip IP cores in the FPGAs. As mentioned above, each FPGA is programmable with pre-verified interface or IP cores. This ensures compliance and compatibility according to a given interface standard. The programmable nature of the FPGA is utilized to optimize flexibility, cost, parallelism and upgradeabilty for storage testing applications from SSDs, HDDs and other protocol based storage devices.

For instance, instantiated FPGA tester block 210A can be configured to run the PCIe protocol while instantiated FPGA tester block 210B can be configured to run the SATA protocol. This allows the tester hardware to test DUTs supporting different protocols simultaneously. FPGA 211A can now be connected to test a DUT that supports both PCIe and SATA protocols. Alternatively, it can be connected to test two different DUTs, one DUT supporting the PCIe protocol and the other DUT supporting the SATA protocol, where each instantiated functional module (e.g., 210A, 210B) is configured with a protocol to test the respective DUT it is connect to.

In one embodiment, the interface or IP core in the FPGA may be acquired from a third party vendor but may require some customization to be compatible with the embodiments described herein. In one embodiment, the interface core provides two functions: a) wraps storage commands into a standard protocol for transmission over a physical channel; and 2) is the electrical signal generator and receiver.

The other major advantage of the architecture presented in FIG. 2 is that it reduces processing load on the tester processor 204 by distributing the command and test pattern generating functionality to FPGA devices, where each DUT has a dedicated FPGA module running the test program specific to it. For instance, instantiated FPGA tester block 210A is connected to DUT 220A and runs test programs specific to DUT 220A. The hardware resources in such a configuration are designed in a manner to support individual DUTs with minimal hardware sharing. This "tester per DUT" configuration also allows more DUTs to be tested per processor and more DUTs to be tested in parallel. Furthermore, with the FPGAs capable of generating their own commands and test patterns in certain modes, the bandwidth requirements on bus 212 connecting the tester processor with the other hardware components, including FPGA devices, device power supplies (DPS) and DUTs, is also reduced. As a result more DUTs can be tested simultaneously than in prior configurations.

Figure 3:
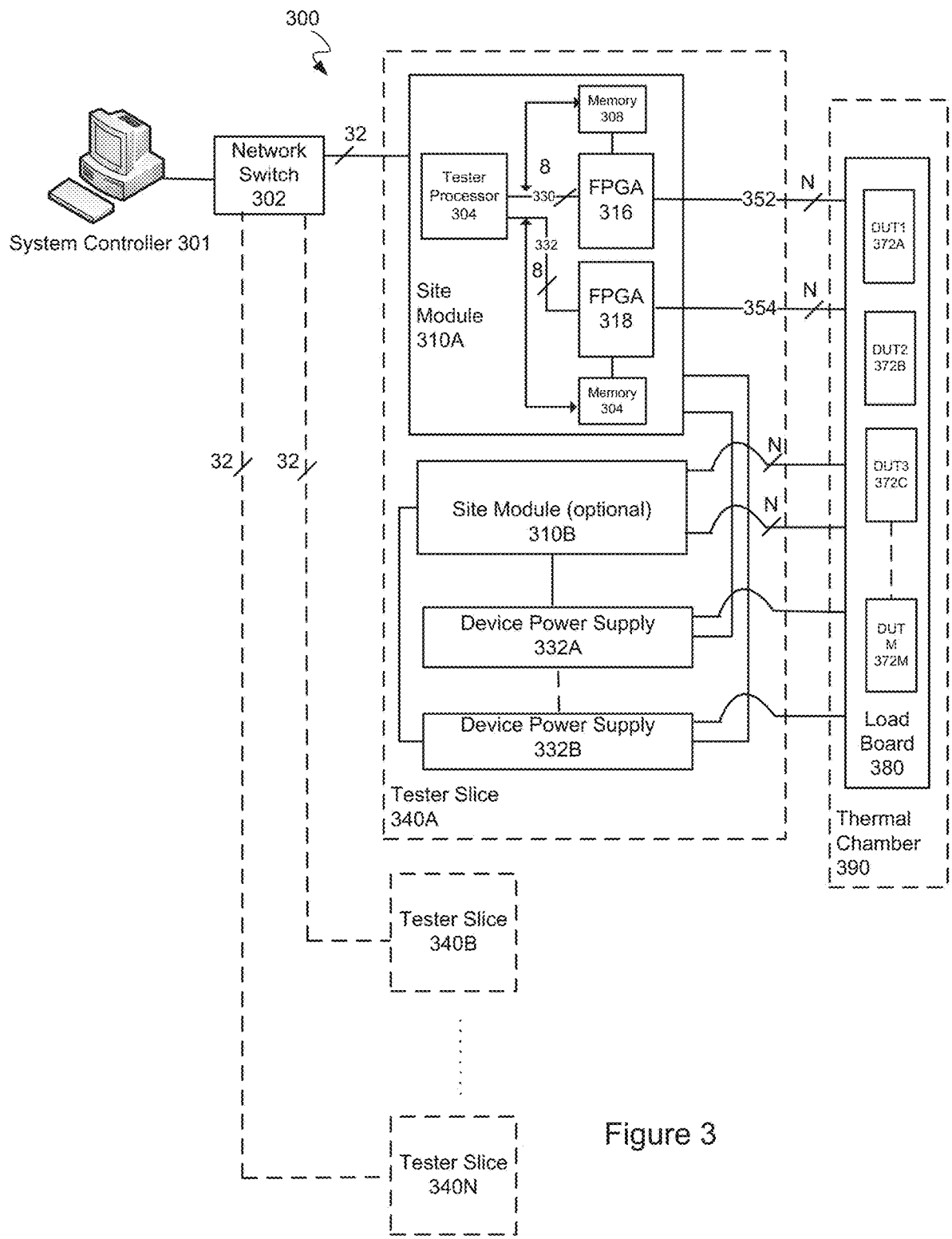
FIG. 3 is a detailed schematic block diagram of the site module and its interconnections with the system controller and the DUTs according to an embodiment of the present invention.

FIG. 3 provides a more detailed schematic block diagram of the site module and its interconnections with the system controller and the DUTs in accordance with an embodiment of the present invention.

Referring to FIG. 3, the site modules of the ATE apparatus, in one embodiment, can be mechanically configured onto tester slices 340A-340N, wherein each tester slice comprises at least one site module. In certain typical embodiments, each tester slice can comprise two site modules and two device power supply boards. In other embodiments, the tester slice may comprise more or fewer site modules and/or power supply boards. Tester slice 340A of FIG. 3, for example, comprises site modules 310A and 310B and device power supply boards 332A and 332B. However, there is no limit to the number of device power supply boards or site modules that can be configured onto a tester slice. Tester slice 340 is connected to system controller 301 through network switch 302. System controller 301 and network switch 302 perform the same function as elements 201 and 202 in FIG. 2 respectively. Network switch 302 can be connected to each of the site modules with a 32 bit wide bus.

As mentioned above, in one embodiment, the system controller 301 may be a computer system, e.g., a personal computer (PC) that provides a user interface for the user of the ATE to load the test programs and run tests for the DUTs connected to the ATE 300. Typically the system controller will run the Windows operating system. The Advantest Stylus is one example of test software normally used during device testing. It provides the user with a graphical user interface from which to configure and control the tests. It can also comprise functionality to control the test flow, control the status of the test program, determine which test program is running, and log test results and other data related to test flow.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe), Serial AT Attachment (SATA) or Serial Attached SCSI (SAS), for instance.

In one embodiment, each site module is configured with two FPGAs as shown in FIG. 3. Each of the FPGAs 316 and 318 in the embodiment of FIG. 3. is controlled by the tester processor 304 and performs a similar function to FPGAs 211A-211M in FIG. 2. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., Serial AT Attachment (SATA) or Serial Attached SCSI (SAS).

FPGAs 316 and 318 are connected to memory modules 308 and 304 respectively, where the memory modules perform a similar function to memory blocks 240A-240N in FIG. 2. The memory modules are coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs in on lines 352 and 354. At the DUT end, however, the load board needs to be designed so as to have connectors specific to the protocol being used by the DUT.

The DUTs 372A-372M, in one embodiment of the invention, are loaded on a load board 380 that is placed inside a thermal chamber 390 for testing. The DUTs 372A-372M and the load board 380 derive power from the device power supplies 332A and 332B.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

In one embodiment, the communication protocol used to communicate between the tester processor 304 and the DUTs 372A-M can advantageously be reconfigurable. The communicative protocol engine in such an implementation is programmed directly into one or both of the FPGAs on the tester slice. The FPGA (e.g., 316 or 318) can therefore be configured to communicate with the DUTs in any protocol that the DUTs support. This advantageously eliminates the need for swapping out tester each time a DUT with a different protocol needs to be tested. In one embodiment, the protocols can be high speed serial protocols, including but not limited to SATA, SAS or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In one embodiment of the present invention, each FPGA comprises a number of protocol engine modules, wherein each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol and the other DUT supporting the SATA protocol.

Figure 4:
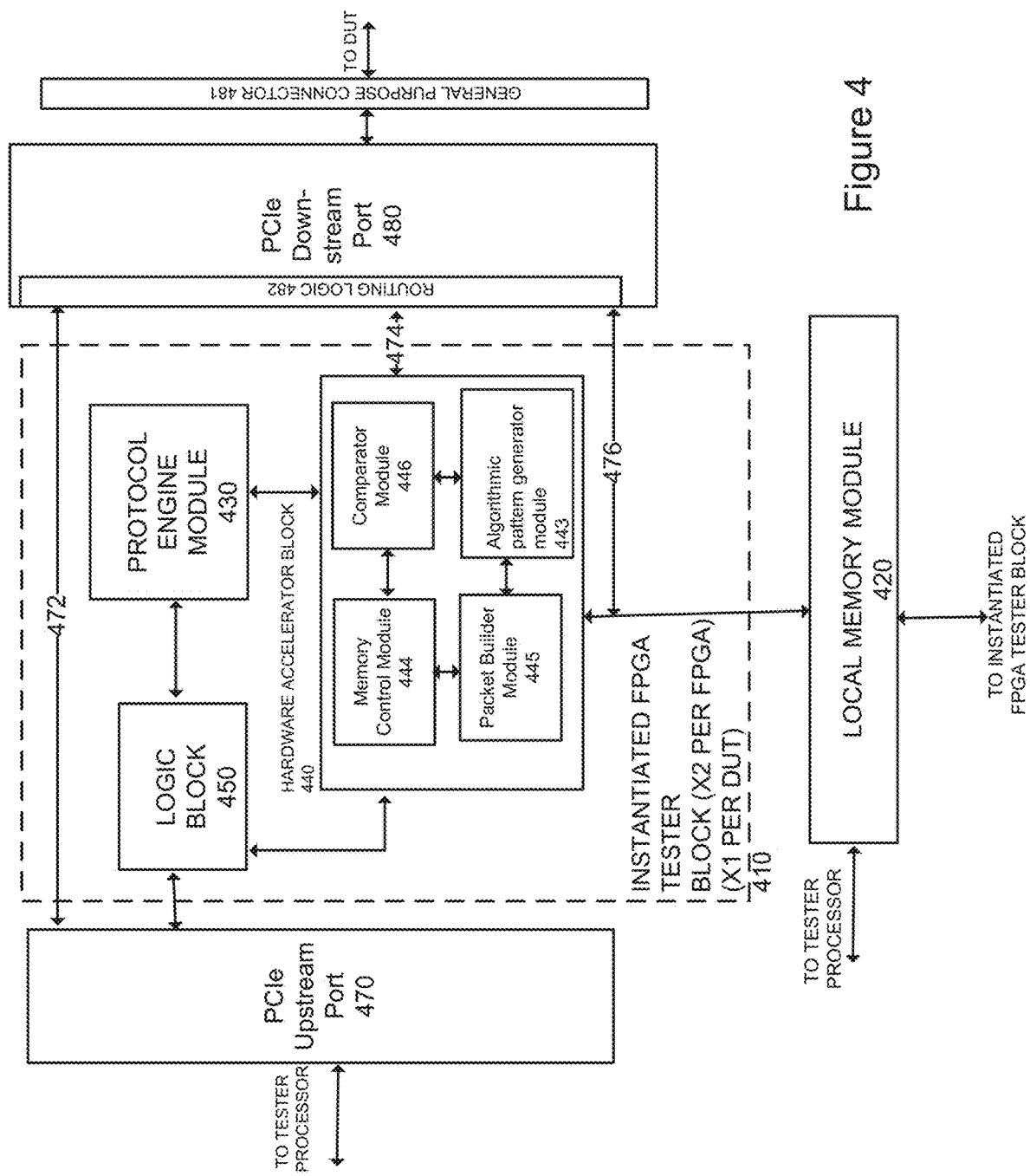
FIG. 4 is a detailed schematic block diagram of the instantiated FPGA tester block of FIG. 2 according to an embodiment of the present invention.

FIG. 4 is a detailed schematic block diagram of an instantiated FPGA tester block of FIG. 2 according to an embodiment of the present invention.

Referring to FIG. 4, the instantiated FPGA tester block 410 is connected to the tester processor through PCIe upstream port 270 and to the DUT through PCIe downstream port 480.

Instantiated FPGA block 410 can comprise a protocol engine module 430, a logic block module 450, and a hardware accelerator block 440. The hardware accelerator block 440 can further comprise a memory control module 444, comparator module 446, a packet builder module 445, and an algorithmic pattern generator (APG) module 443.

In one embodiment, logic block module 450 comprises decode logic to decode the commands from the tester processor, routing logic to route all the incoming commands and data from the tester processor 304 and the data generated by the FPGA devices to the appropriate modules, and arbitration logic to arbitrate between the various communication paths within instantiated FPGA tester block 410.

In one implementation, the communication protocol used to communicate between the tester processor and the DUTs can advantageously be reconfigurable. The communication protocol engine in such an implementation is programmed directly into the protocol engine module 430 of instantiated FPGA tester block 410. The instantiated FPGA tester block 410 can therefore be configured to communicate with the DUTs in any protocol that the DUTs support. The pre-verified interface or IP cores mentioned above, for example, can be programmed into the protocol engine module 430. This ensures compliance and compatibility according to a given interface standard. Further, the IP core allows the tester to achieve flexibility in that the IP core enables software-based changing of interfaces. Embodiments provide an ability to test multiple types of DUTs independent of the hardware bus adapter sockets. With such interface flexibility, new interfaces may be loaded into the IP core of a programmable chip thereby eliminating the need for the hardware bus adapter sockets (discussed in connection with FIG. 1).

In one embodiment, for example, for storage/SSDs/HDDs, each FPGA comprises a configurable IC that connects to a SSD and that is programmable to provide storage based patterns through a storage specific interface such as SATA or SAS.

In one embodiment, an FPGA may be an SSD module-based tester that uses protocol-based communications to interface with a DUT or module. In one embodiment, the configurable interface core may be programmed to provide any standardized protocol-based communications interface. For example, in one embodiment, in the case of an SSD module-base test, the interface core may be programmed to provide standardized protocol-based communications interfaces such as SATA, SAS, etc.

Accordingly, from an electrical perspective, the FPGAs utilize an IP core instead of a hardware bus adapter socket. Enabled by software programming of the programmable chip resources of an FPGA, a given IP core may be easily reprogrammed and replaced with another IP core without changing the physical FPGA chip or other hardware components. For example, if a given FPGA-based tester currently supports SATA, all that would be required to be able to connect to a SAS DUT is for the FPGA to be reprogrammed to use a SAS IP core instead of the existing IP core configured for SATA.

This advantageously eliminates the need for hardware bus adapter cards and no protocol-specific hardware need be replaced to test DUTs with different protocol support. In one embodiment, the protocols can be high speed serial protocols, including but not limited to SATA, SAS or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In FIG. 4, if the DUT coupled to the PCIe downstream port 480 is a PCIe device, a bit-file containing the instantiation of the PCIe protocol can be downloaded through the PCIe upstream port 470 and installed in the IP core on the protocol engine module 430. Each FPGA device 316 or 318 can comprise one or more instantiated FPGA tester block and, consequently, one or more protocol engine modules. The number of protocol engine modules that any one FPGA device can support is limited only by the size and gate count of the FPGA.

In one embodiment of the present invention, each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol and the other DUT supporting the SATA protocol.

The hardware accelerator block 440 of FIG. 4 can be used to expedite certain functions on FPGA hardware than would be possible to do in software on the tester processor. The hardware accelerator block 440 can supply the initial test pattern data used in testing the DUTs. It can also contain functionality to generate certain commands used to control the testing of the DUTs. To generate test pattern data, accelerator block 440 uses the algorithmic pattern generator module 443.

The hardware accelerator block 440 can use comparator module 446 to compare the data being read from the DUTs to the data that was written to the DUTs in a prior cycle. The comparator module 446 comprises functionality to flag a mismatch to the tester processor 304 to identify devices that are not in compliance. More specifically, the comparator module 446 can comprise an error counter that keeps track of the mismatches and communicates them to the tester processor 304.

Hardware accelerator block 440 can connect to a local memory module 420. Memory module 420 performs a similar function to a memory module within any of the memory blocks 240A-240M. Memory module 420 can be controlled by both the hardware accelerator block 440 and the tester processor 304. The tester processor 304 can control the local memory module 420 and write the initial test pattern data to it.

The memory module 420 stores the test pattern data to be written to the DUTs and the hardware accelerator block 440 accesses it to compare the data stored to the data read from the DUTs after the write cycle. The local memory module 420 can also be used to log failures. The memory module would store a log file with a record of all the failures the DUTs experienced during testing. In one embodiment, the accelerator block 440 has a dedicated local memory module block 420 that is not accessible by any other instantiated FPGA tester blocks. In another embodiment, the local memory module block 420 is shared with a hardware accelerator block in another instantiated FPGA tester block.

Hardware accelerator block 440 can also comprise a memory control module 444. The memory control module 444 interacts with and controls read and write access to the memory module 420.

Finally, hardware accelerator block 440 comprises a packet builder module 445. The packet builder module is used by the hardware accelerator block in certain modes to construct packets to be written out to the DUTs comprising header/command data and test pattern data.

In certain embodiments, hardware accelerator block 440 can be programmed by the tester processor 304 to operate in one of several modes of hardware acceleration.

In bypass or standard mode, the hardware accelerator is bypassed and commands and test data are sent by the tester processor 304 directly to the DUT through path 472.

In hardware accelerator pattern generator mode, test pattern data is generated by the APG module 443 while the commands are generated by the tester processor 304. The test packets are transmitted to the DUT through path 474. This mode is also known as Protocol Independent Data Acceleration (PIDA) mode.

In hardware accelerator memory mode, the test pattern data is accessed from local memory module 420 while the commands are generated by the tester processor 304. The test pattern data is transmitted to the DUT through path 476. Routing logic 482 is needed to arbitrate between paths 472, 474 and 476 to control the flow of data to the DUT.

In hardware accelerator packet builder mode, the test pattern data may be generated by the APG module 443 and the packet builder module 445 is used to construct packets to be written out to the DUTs comprising header/command data and test pattern data. The test packets are transmitted to the DUT through path 474. This mode is also known as Full Acceleration (FA) mode.

The site module can comprise a general purpose connector 481. Because the protocol engine module 430 can be configured to run any number of various communicative protocols, a general purpose high speed connector 481 is required on the site module. Accordingly, if the protocol implemented on the protocol engine module 430 needs to be changed, no accompanying physical modification needs to be made on the site module. The site module connects to the DUT using load board 380 that can connect to the general purpose connector on the site module end, but is specific to the protocol being implemented on the DUT end. DUTs supporting different communicative protocols will require different configurations. Accordingly, the load board needs to be switched out and replaced if the protocol is reprogrammed to accommodate DUTs requiring a different configuration.

FIG. 10 illustrates a primitive 1010 interfaced with a Device Interface Board (DIB) 1000 in accordance with an embodiment of the invention. Similar to the tester slice (e.g., 340A, etc.) shown in FIG. 3, the primitive of FIG. 10 is a type of discrete test module that fits into a test head and comprises the test circuitry, which performs tests on the DUTs in accordance with a test plan. A primitive comprises an enclosure 1050 within which all the various electronics, e.g., site modules, power supplies, etc. are housed. The DIB 1000 can connect with a plurality of DUTs 1020 using custom connectors sized for the DUTs 1020. The DUTs physically interface and electronically interface to the DIB 1000. The primitive can also comprise an enclosure 1070. The DIB 1000 interfaces to a universal backplane (not shown) of the primitive 1010 through a load board (not shown) similar to load board 380 shown in FIG. 3. The primitive 1010 contains test circuitry (similar to tester slice 340A shown in FIG. 3) for performing a test plan on the DUTs 1020. The primitive 1010 can operate independently of any other primitive and is connected to a control server (similar to system controller 301 shown in FIG. 3).

It should be noted that DUTs connected to any given tester slice (e.g., 340A-340N) or any given primitive are capable of running a different protocol than one or more other DUTs connected to the same respective tester slice or primitive. For example, the primitive 1010 may be connected to and used to test a plurality of DUTs 1020, each of which can run a different protocol, e.g., SATA, ATA, SCSI, etc. In one embodiment, primitive 1010 may be connected to and used to test primarily SSD drives.

Figure 11:
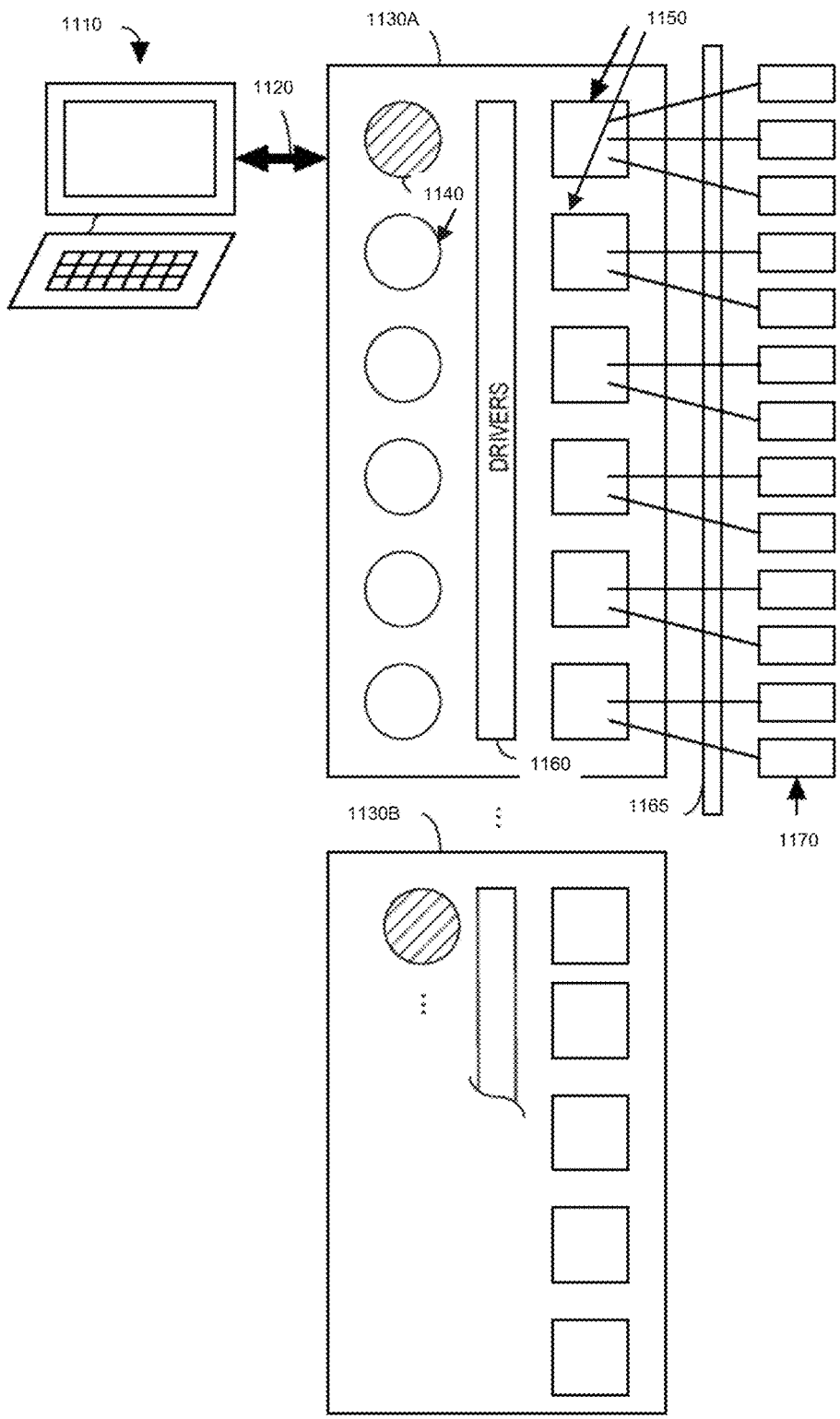
FIG. 11 is an exemplary high level block diagram of the automatic test equipment apparatus in which a host controller is connected to and controls test operations for a plurality of primitives in accordance with an embodiment of the present invention.

FIG. 11 is an exemplary high level block diagram of the automatic test equipment (ATE) apparatus in which a host controller is connected to and controls test operations for a plurality of primitives in accordance with an embodiment of the present invention. FIG. 11 illustrates the overall integrated system or testing framework 1105 for testing SSDs supporting various odd sector sizes (or non-standard sector sizes) and protection modes.

In one embodiment, a Windows based host controller 1110 may be communicatively coupled to several different primitives, e.g., 1130A and 1130B. The Windows based host controller 1110 is capable of displaying graphical user interfaces to users for displaying information and for accepting user input. A communication backplane 1120 is coupled between the host controller 1110 and one or more primitives 1130A and 1130B. Each primitive comprises a number of tester slices (e.g., tester slices 340A-340N). In one embodiment, each primitive may comprise a number of COM boards 1140 (comprising a tester processor and associated memory) that are coupled to a number of FPGA tester slices 1150 via drivers 1160. (As mentioned previously, in one embodiment, the tester processor may be located on a COM board that is a separate board from the tester slices comprising the FPGAs). The tester slices, in one embodiment, are coupled to DUTs (e.g. SSDs) via a device interface board 1165. A different DIB can be used to support SSDs of different form factors and connection types. There can be several primitives within a rack, where each primitive is coupled to and controlled by the host controller. This allows a large volume of DUTs to be tested concurrently.

In one embodiment, the COM boards 1140 may contain an instance of the embedded OS platform in accordance with the present invention. The COM boards 1140 may control the tester slices 1150 within the primitives. The embedded OS platform is configured to communicate on one side with the host controller 1110 and on the other side the various FPGA tester slices 1150 that are populated within a primitive. In one embodiment, the embedded OS platform can be a heavily modified version of the Linux OS. There can be as many as 32 instances of embedded OS platforms within the system 1105 and controlled by the host controller 1110. The various OS platforms provide functionality to communicate with the FPGA tester boards 1150 also to communicate directly with the DUTS 1170.

FIG. 12A illustrates the various protection modes and odd sector sizes that can be supported by the ATE platforms in accordance with an embodiment of the present invention. As mentioned previously, conventional tester systems only contain support for testing SSDs with standard sector sizes, e.g., 512 BPS or 4096 BPS. However, certain SSD vendors also support non-standard sector sizes, e.g., 520 bytes per sector (BPS) or 528 bytes per sector (BPS) especially for drives to be used in enterprise-grade systems. Meanwhile, other SSD vendors enable various protection modes in their drives (for higher resiliency, reliability and integrity) that require additional bytes of metadata per sector (e.g., 8 bytes of protection information). Currently, there are no tester systems in the market that support testing of SSDs with protection modes and non-standard sector sizes at high speeds.

Embodiments of the present invention support testing of drives that may have various protection modes enabled. For example, certain SSDs may have an extra 8 bytes of metadata per sector (e.g., 512+8, 4096+8). It should be noted that the values provided in the table in FIG. 12A are merely exemplary. There can be additional variations of data and metadata fields. For instance, there can be more than 8 bytes of metadata for certain protection modes.

FIG. 12B illustrates the information encoded in the metadata for the protection modes supported by various SSDs. As mentioned above, certain protection modes will support up to 8 bytes of metadata or protection information. The protection information will typically comprise 2 bytes of guard cyclic redundancy check (CRC) 1254, 2 bytes for an application tag 1256, and 4 types for a reference tag 1258. The various different protection modes that may be supported are detailed in the Data Integrity Field (DIF) specification.

Embodiments of the present invention also support testing of drives with non-standard sector sizes. For example, as shown in the table of FIG. 11A, the odd sector sizes supported by embodiments of the present invention may be 520+0 (520 bytes per sector with 0 bytes of metadata), 4104 BPS, 528 BPS and 4224 BPS. It should be noted here that the values for non-standard sector sizes are merely exemplary. There may be many different odd sectors supported by various drives depending on the vendor.

Embodiments of the present invention advantageously allow all combinations of protection modes and all combinations of variable sector sizes for the various DUTs to be flexibly supported in all the various hardware acceleration modes. For example, in PIDA mode, the commands are generated by the tester processor on the COM board but the test pattern data is generated by the FPGAs. In this instance, the embedded OS allows commands to be generated by the tester processor that support the various protection modes and odd sector sizes. Furthermore, the FPGAs can generate the data for the protection modes and various odd sector sizes much faster than conventional tester systems. Similarly, in full acceleration mode, the FPGA generates both the commands and data to support the various protection modes and odd sector sizes at much faster rates than conventional tester systems. For example, the calculations and computations to determine the various fields of the protection information (as shown in FIG. 12B) are performed much faster in the FPGAs than if the tester processor was performing the computations for all connected SSDs. Similarly, the FPGAs can generate the data for non-standard sector sizes (e.g., 520, 4104) much faster than the tester processor.

In providing the variable sector size support, the embedded OS allows a "C" based tester scripting language to be used that can alter the sector size for the various SSDs being tested. Therefore, any sector size (from 512 to 4 k, for instance) can be applied for testing across the various DUTs 1170. This sector size configuration can originate from the host computer and be applied to all primitives and subsequently to any or all DUTs 1170. With respect to protection mode support, any combination of protection mode support can be applied across the DUTs 1170 and can originate from host computer 1110. Protection mode, as mentioned above, influences the manner in which metadata is generated by the software or firmware. In particular, application of protection mode configuration alters the makeup of the metadata bytes that follow or are otherwise associated with a data packet. Any of the combinations of protection modes along with any combination of sector size can be applied across the primitives 1130A, 1130B from the host controller 1110. In other words, the firmware of the system allows hardware acceleration to be applied to all combinations of protection modes along with any combination of odd sector size. Applying hardware acceleration allows the SSDs to be tested faster because the FPGAs serialize the data and transmit it to the DUTs at much higher speeds than the tester processor itself, e.g., in PIDA and FA modes, the FPGA generates all the data and transmits it to the DUTs. Further, the firmware also allows the protection information for the protection mode to be calculated at high speeds using the FPGAs. Additionally, because the FPGAs are located in close proximity to the DUTs, the data is transmitted to and received from the DUTs faster.

Conventional tester systems, by comparison, do not have a mechanism to be able to test drives supporting protection modes and odd sector sizes. Furthermore, conventional tester systems were not able to test drives supporting protection modes and odd sector sizes at high speeds using firmware acceleration. Conventional tester systems only had the capability of testing drives that were formatted for standard sector sizes, e.g., 512 BPS.

In one embodiment, the tester framework 1105 also supports testing SSDs for the various sector sizes and protection modes they support at high speeds without needing to swap devices. For example, DUTs 1170 in Figure may support several different sector sizes and protection modes. The DUTs may, for instance, support 512+0, 512+8 (8 bytes of protection information metadata), and also an odd-sector size of 528. The tester framework 1105 cycles through the various sector sizes and protection modes and tests the DUTs for all possible configurations using the hardware acceleration modes. For example, the tester framework may first test the DUTs for 512 BPS. The tester framework may be configured to then re-format the drives and test them for 512+8 BPS, wherein the computations to generate the protection information and to generate the data for testing is performed by the FPGAs in one of the hardware acceleration modes, e.g. PIDA or FA. Subsequently, the tester framework may again re-format the drives and generate data at the FPGA level (in one of the acceleration modes) to test the SSDs for the non-standard sector size of 528. In this way, embodiments of the present invention can test all connected DUTs for all supported sector sizes and protection modes at high speeds without the need for disconnecting or replacing the devices.

As mentioned above, conventional tester systems also did not have any ability to test drives formatted for non-standard sector sizes. Embodiments of the present invention allow drives formatted for non-standard sector sizes (e.g., 520+0, 4104+0, etc.) both with and without hardware acceleration. In other words, the embedded OS in the tester processor 304, for example, is able to generate commands and test patterns to test drives formatted for odd sectors in standard (or bypass) mode. In other words, embodiments of the present invention can test drives formatted for odd sectors bypassing all of the FPGAs. Furthermore, embodiments of the present invention can also test drives formatted for odd sector sizes in any of the three hardware acceleration modes (e.g., hardware accelerator pattern generator or PIDA mode, hardware accelerator memory mode, and full acceleration mode).

Embodiments of the present invention in both standard mode and in the three hardware acceleration modes need to be able to perform the significant computations to generate repeatable test data for non-standard sector sizes (that are not a power of 2). The data generated for testing needs to be repeatable so that it can be written to the sector in a different order than it is read. In other words, if the data is not read in the same order as it is written, it is nevertheless important for it to be verifiable. Accordingly, the test patterns written into the odd sector sizes need to be repeatable.

Embodiments of the present invention are configured to perform the calculations to generate repeatable random or pseudo-random data for arbitrary sector sizes. Both the tester processor (for standard mode) and the FPGAs (for the hardware acceleration modes) will be programmed with an algorithm that generates random numbers using the sector number as a seed. In other words, the random data that is generated will be a function of the sector address. Using the sector number as a seed, the algorithm will generate a reproducible sequence of any length, e.g., the length of the odd sector size. When the data needs to be read back, it can be regenerated again (using the sector address as a seed) so that it can be compared with the data read back from the DUTs in order to ensure the integrity of the DUTs.

Figure 5:
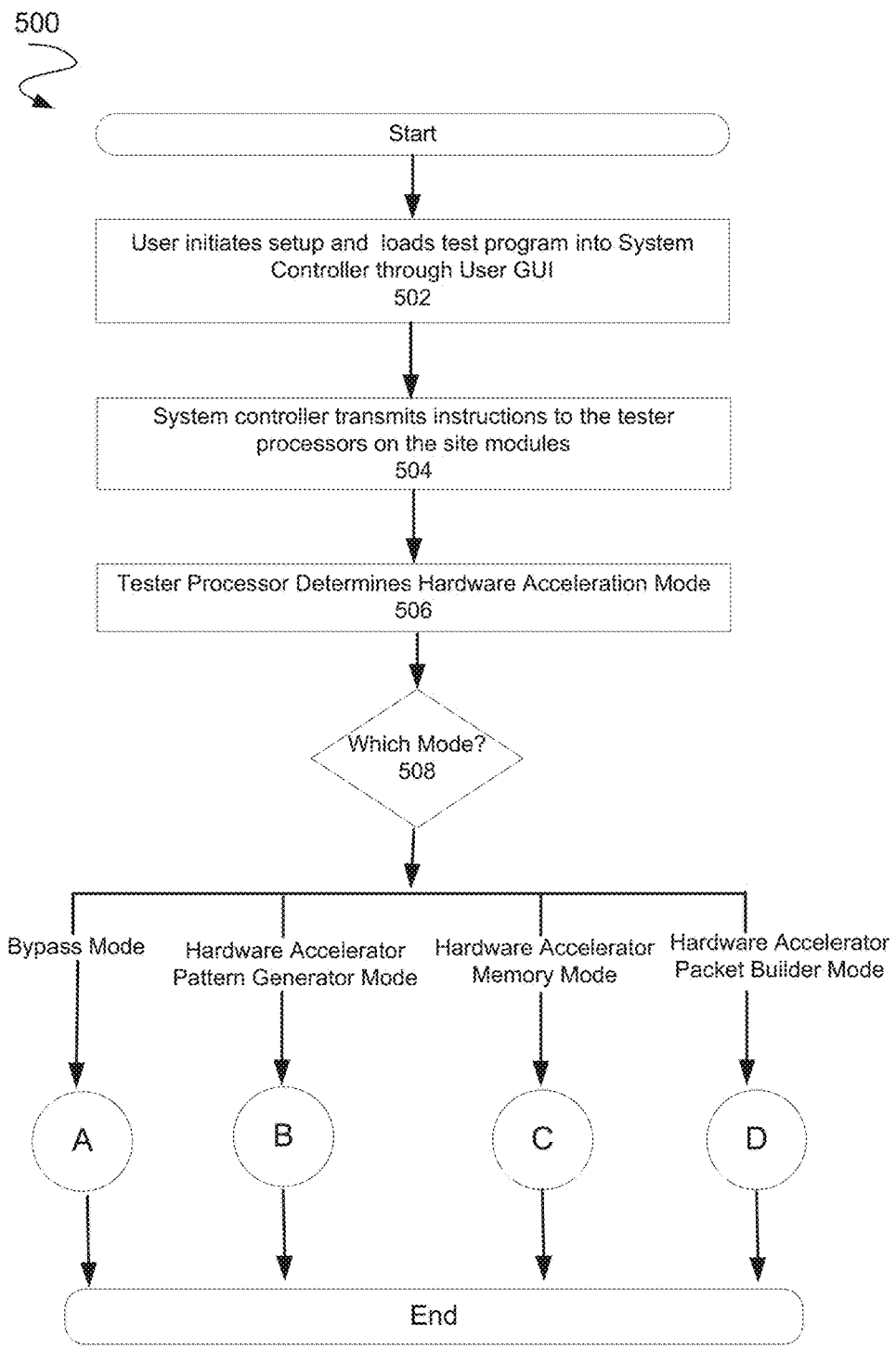
FIG. 5 is a high level flowchart of an exemplary method of testing DUTs according to an embodiment of the present invention.

FIG. 5 depicts a flowchart 500 of an exemplary process of testing DUTs according to an embodiment of the present invention. The invention, however, is not limited to the description provided by flowchart 500. Rather, it will be apparent to persons skilled in the relevant art(s) from the teachings provided herein that other functional flows are within the scope and spirit of the present invention.

Flowchart 500 will be described with continued reference to exemplary embodiments described above in reference to FIGS. 2, 3 and 4, though the method is not limited to those embodiments.

Referring now to FIG. 5, the user initiates setup and loads the test program into system controller at block 502. Initiating setup can comprise choosing one or more protocols from a library of available protocols to be configured onto the FPGA devices in the ATE apparatus 200. The protocols are cached as files on the system controller 301 and can be downloaded as bit files onto the FPGAs. The user can select the protocol from a list of releases available through a graphical user interface. Before a protocol is made available as an option, it has to be built, tested and integrated into a release. FPGA configurations that are released, among other things, contain definitions regarding the protocols supported and the number of transceivers available to connect DUTs. The library of releases can then be made available to a user through a graphical user interface on the system or host controller.

At block 502, the user also loads the test program into the system controller 301 through the graphical user interface. The test program defines all the parameters of the test that needs to be run on the DUTs. At block 504, the system controller transmits instructions to the tester processor on the site module 310A. This step includes the transmission of the bit files for the protocol engines to be programmed onto the FPGAs. The system controller can comprise routing logic to route instructions for a particular test program to the tester processor connected to the DUT controlled by the test program.

At block 506, after receiving instructions from the system controller, the tester processor 304 can determine the hardware acceleration mode for running the tests on the DUTs connected to site module 310A.

In one embodiment, the tester processor 304 can operate in one of four different hardware acceleration modes. Each functional mode is configured to allocate functionality for generating commands and test data between the tester processor 304 and the FPGAs 316 and 318. In one embodiment, the tester processor can be programmed to operate in bypass or standard mode, wherein all the commands and test data for testing the DUTs is generated by the tester processor 304 and the FPGAs 316 and 318 are bypassed.

In another embodiment, the tester processor 304 can be programmed to operate in hardware accelerator pattern generator mode (or PIDA mode), wherein pseudo-random or random data to be used in the testing of the DUTs is generated by the FPGAs 316 and 318 and the comparing is also done by the FPGAs, but the tester processor handles the command generation.

In yet another embodiment, the tester processor 304 can be programmed to operate in hardware accelerator memory mode, wherein the test pattern is pre-written onto the memory module connected to each FPGA 316 and 318 by the tester processor during initial set-up. The FPGAs in this mode access the dedicated memory device to retrieve the test data to be written to the DUTs, read the test data from the DUTs and compare the read data with the data written on the memory device. In this mode, each of the FPGAs control the memory device in response to read and write operations from the DUTs. The tester processor, however, is still responsible for the command generation in this mode.

In still another embodiment, the tester processor 304 can be programmed to operate in hardware accelerator packet builder mode (or Full Acceleration mode), wherein the data and basic read/writ/compare commands are generated by the FPGAs 316 and 318.

At block 508, the tester processor branches out to the mode under which the test will be run.

It should be noted that the FPGA 1035 of FIG. 10 can be programmed with any of the four functional modes discussed above, namely, the bypass mode, the hardware accelerator pattern generator mode, the hardware accelerator memory mode and the hardware accelerator packet builder mode. In one embodiment, the computer or system controller that the tester card 1000 is connected to via connector 1010 will perform the functions of the tester processor 304.

Figure 6:
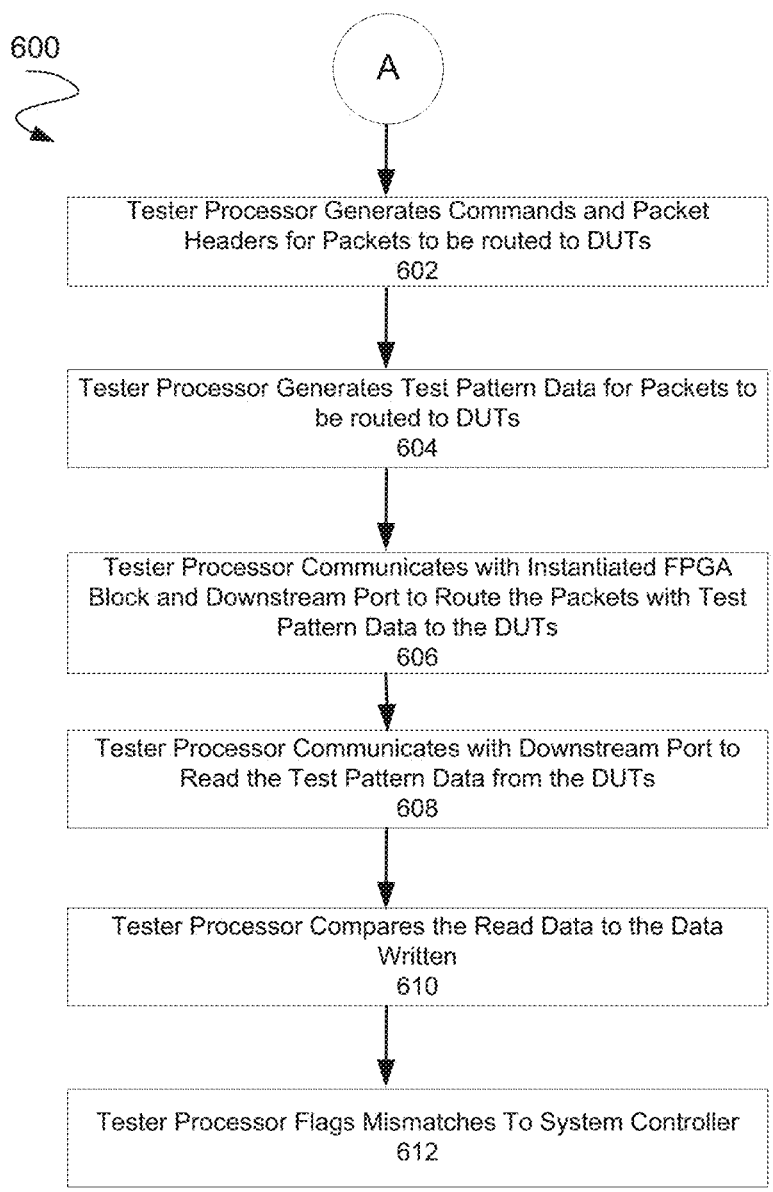
FIG. 6 is a continuation of FIG. 5 and is a flowchart of an exemplary method of testing DUTs in the bypass mode in one embodiment of the present invention.

FIG. 6 depicts a flowchart 600 of an exemplary process of testing DUTs in the bypass mode according to an embodiment of the present invention. The invention, however, is not limited to the description provided by flowchart 600. Rather, it will be apparent to persons skilled in the relevant art(s) from the teachings provided herein that other functional flows are within the scope and spirit of the present invention.

Flowchart 600 will be described with continued reference to exemplary embodiments described above in reference to FIGS. 2, 3 and 4, though the method is not limited to those embodiments.

Referring now to FIG. 6, in bypass mode, at block 602 the tester processor 304 generates commands and packet headers for the test packets to be routed to the DUTs. The tester process at block 604 also generates the test pattern data for the packets to be routed to the DUTs. In this mode there is no hardware acceleration because the tester processor generates its own commands and test data.

At block 606, the tester processor communicates with instantiated FPGA block 410 and downstream port 480 to route the test packets containing the test pattern data to the DUTs. The bypass mode is a pass through mode, wherein, with some limited exceptions, the commands and data pass transparently through the instantiated FPGA block 410 directly to the DUTs. The DUTs are directly controlled by the tester processor 304 in bypass mode. While the instantiated FPGA block can comprise logic to route the packets through to the downstream port, it is not involved in either the command generation (also referred to as "signaling") or the data generation.

At block 608, the tester processor 304 communicates with downstream port 480 to initiate a read operation from the DUTs of the data that was previously written to the DUTs at block 606. At block 610, the tester processor compares the data read from the DUTs to the data written at block 606. If there is any mismatch between the data written at block 606 and the data read at block 610, a flag is sent by the tester processor 304 to the system controller 301 at block 612. The system controller will then flag the mismatch to the user.

In bypass mode, tester processor 304 is constrained in the number of DUTs it can support because its processing capabilities can be maximized quickly from generating all the commands and test data for the DUTs. Also, the number of DUTs that can be supported by site module 310A is further limited by the bandwidth constraints on system buses 330 and 332. In bypass mode, the bandwidth of buses 330 and 332 is exhausted relatively quickly because of the large volume of data that is transmitted by the tester processor 304 over to the DUTs. Thus, other modes with more hardware acceleration are made available, wherein the FPGA devices have more functionality to generate test data and commands.

Figure 7:
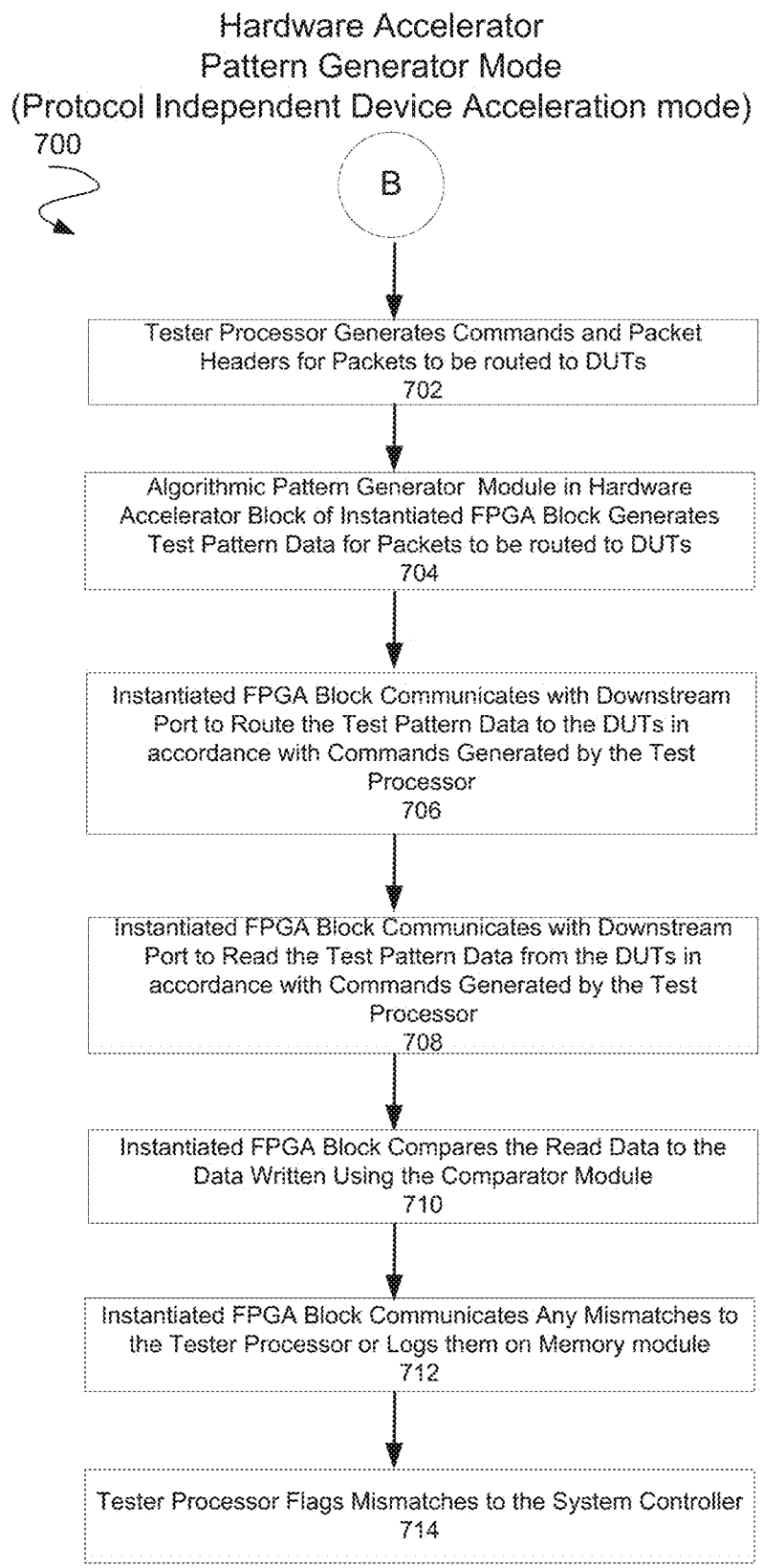
FIG. 7 is a continuation of FIG. 5 and is a flow chart of an exemplary method of testing DUTs in the hardware accelerator pattern generator mode in one embodiment of the present invention.

FIG. 7 depicts a flowchart 700 of an exemplary process of testing DUTs in the hardware accelerator pattern generator mode according to an embodiment of the present invention. The invention, however, is not limited to the description provided by flowchart 700. Rather, it will be apparent to persons skilled in the relevant art(s) from the teachings provided herein that other functional flows are within the scope and spirit of the present invention.

Flowchart 700 will be described with continued reference to exemplary embodiments described above in reference to FIGS. 2, 3 and 4, though the method is not limited to those embodiments.

Referring now to FIG. 7, a method of hardware acceleration is shown wherein the FPGA devices share data generation functionality so as to relieve the processing load on the tester processor 304 and the data load on system buses 330 and 332. At block 702 of the hardware accelerator pattern generator mode, the tester processor 304 generates commands and packet headers for the packets to be routed to the DUTs. The tester process retains the functionality for signaling in this mode. The algorithmic pattern generator module 443 within the hardware accelerator block 440 generates the pseudo random test data to be written to the DUTs at block 704. The logic block module 450 comprises functionality for routing the data generated and adding it to the packets to be written out to the DUTs.

The mode is considered "hardware accelerated" because the functionality for generating data can be done much faster in hardware by the algorithmic pattern generator of the FPGA device than in software by the tester processor. Also the "tester per DUT" architecture allows the DUT to be directly connected to its own dedicated instantiated FPGA tester block generating test pattern data for the DUT as shown in FIG. 4, which results in a substantial increase in bandwidth over the bypass mode where the tester processor 304 supplies all commands and data to the DUTs over system buses 330 and 332. With the FPGA devices sharing in the data generation functionality, the system buses 330 and 332 are freed up so commands can be communicated to the FPGAs at a faster rate than in the bypass mode. Further, for devices, such as solid state drives that require several iterations of testing, having a dedicated data path through the instantiated FPGA tester block speeds up testing considerably over one where the resources of the tester processor are shared by several DUTs. It also allows the DUT to operate at close to full performance because it does not have to wait for the tester processor to allocate processing resources to it.

In one embodiment, the algorithmic pattern generator module 443 can be programmed to generate data on the fly. The APG module can generate incremental patterns, pseudo-random patterns or some type of constant pattern. The APG module can also have certain gating capabilities to generate test patterns with stripes, diagonal stripes or alternating patterns. In one embodiment, the APG module can use finite state machines, counters or linear feedback shift registers, among other things, to generate test patterns.

In some implementations, the APG module can be provided a starting seed as an initial value to generate more complex random patterns. As mentioned above, for example, using the sector number as a seed, the APG module will generate a reproducible sequence of any length, e.g., the length of the odd sector size. When the data needs to be read back, it can be regenerated again (using the sector address as a seed) so that it can be compared with the data read back from the DUTs in order to ensure the integrity of the DUTs.

At step 706, the instantiated FPGA block 410 communicates with the downstream port 480 to route the test pattern data to the DUTs in accordance with the commands and packet headers generated by the tester processor. The instantiated FPGA block 410, at step 708, communicates with the downstream port to read the test pattern data from the DUTs in accordance with commands generated by the tester processor. The comparator module 446 of the hardware accelerator block 440 is then used to compare the read data to the data written to the DUTs at block 710. The APG module 443 is designed in a way such that the comparator module can perform read operations on it with the same parameters that were used to generate the pseudo-random data and receive the same data that was written to the DUTs at block 704. The APG module 443 regenerates the data that was written to the DUTs on the fly and communicates it to the comparator module 446. Any mismatches are either logged on memory module 420 by the memory control module 444 or communicated by the instantiated FPGA block to the tester processor at block 712. The tester processor subsequently flags mismatches to the system controller at block 714 after receiving the error log.

Figure 8:
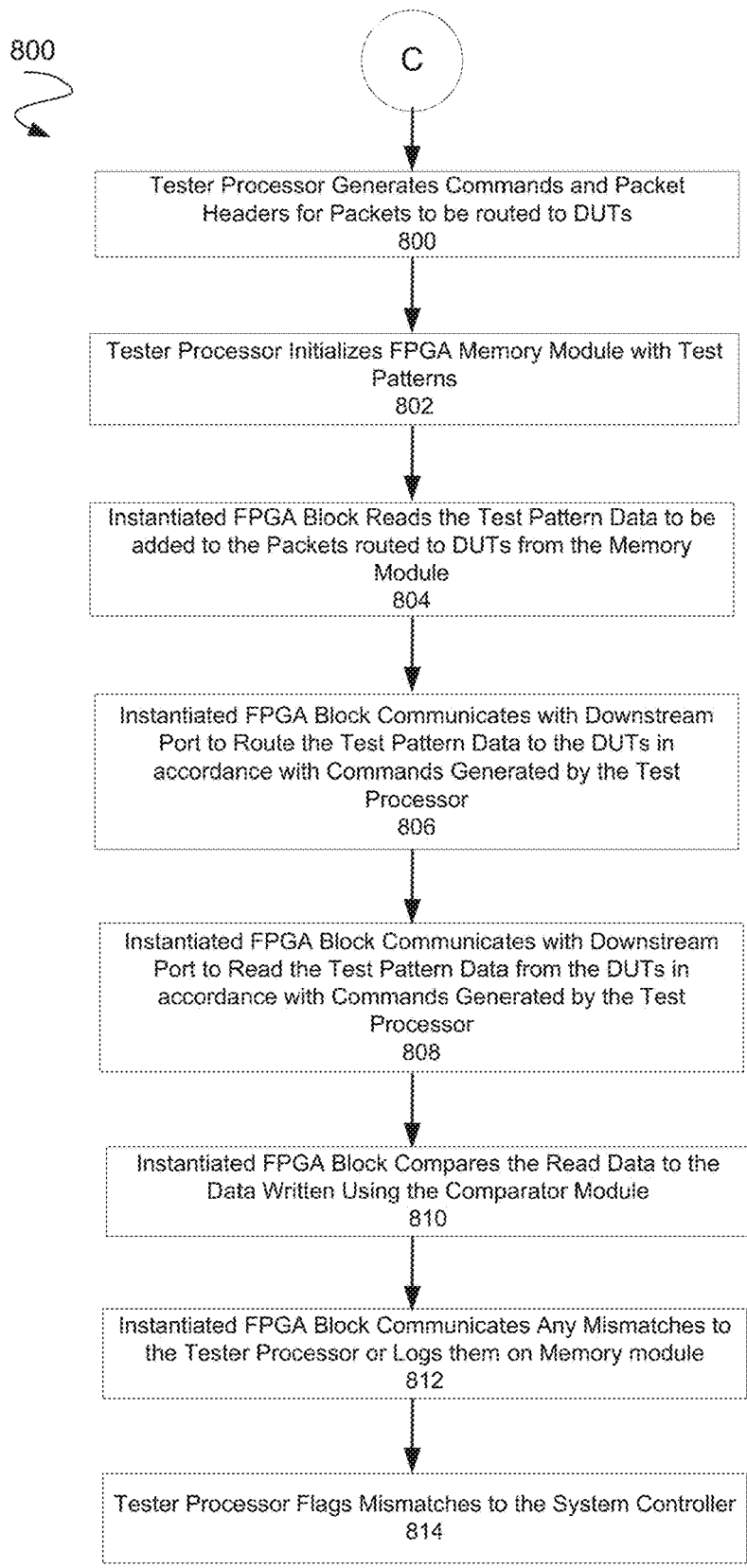
FIG. 8 is a continuation of FIG. 5 and is a flow chart of an exemplary method of testing DUTs in the hardware accelerator memory mode in one embodiment of the present invention.

FIG. 8 depicts a flowchart 800 of an exemplary process of testing DUTs in the hardware accelerator memory mode according to an embodiment of the present invention. The invention, however, is not limited to the description provided by flowchart 800. Rather, it will be apparent to persons skilled in the relevant art(s) from the teachings provided herein that other functional flows are within the scope and spirit of the present invention.

Flowchart 800 will be described with continued reference to exemplary embodiments described above in reference to FIGS. 2, 3 and 4, though the method is not limited to those embodiments.

Referring now to FIG. 8, a method of hardware acceleration is shown wherein the FPGA devices share data generation functionality so as to relieve the processing load on the tester processor 304 and the data load on system buses 330 and 332. As compared to the hardware accelerator pattern generator mode, in the hardware accelerator memory mode, the instantiated FPGA tester block accesses local memory module 420 for the data to be written to the DUTs instead of using the APG module 443.

At block 800 of the hardware accelerator pattern memory mode, the tester processor 304 generates commands and packet headers for the packets to be routed to the DUTs. The tester process retains the functionality for signaling in this mode. At block 802, the tester processor initializes the local memory module 420 of the instantiated FPGA tester block 410 with test patterns to be written out to the DUTs. One advantage of the hardware accelerator memory mode is that the test patterns generated by the tester processor may constitute real random data as opposed to pseudo-random data generated by the APG module 443 in the hardware accelerator pattern generator mode. Both the tester processor and the instantiated FPGA tester block have read and write access to the local memory module 420. However, the tester processor only accesses memory module 420 during initial set-up. During the accelerator mode, the tester processor does not access the memory module because the additional processing load on the tester processor 304 and the additional data load on the system buses 330 and 332 slows the acceleration down considerably.

At block 804, the instantiated FPGA tester block reads the test pattern data to be routed to the DUTs from the memory module 420. Because the memory module 420 is dedicated to the FPGA tester block or shared with just one other FPGA tester block, there is a high bandwidth connection between the two resulting in fast read operations. The logic block module 450 comprises functionality for routing the data generated and adding it to the packets to be written out to the DUTs.

After the data has been added to the packets, at block 806, the instantiated FPGA tester block communicates with the downstream port 480 to route the test pattern data to the DUTs in accordance with the commands and packet headers generated by the tester processor. The instantiated FPGA block 410, at step 808, communicates with the downstream port to read the test pattern data from the DUTs in accordance with commands generated by the tester processor. The comparator module 446 of the hardware accelerator block 440 is then used to compare the read data to the data written to the DUTs at block 810. Any mismatches are either logged on memory module 420 or communicated by the instantiated FPGA block to the tester processor at block 812. The tester processor subsequently flags mismatches to the system controller at block 814 after receiving the error log.

Figure 9:
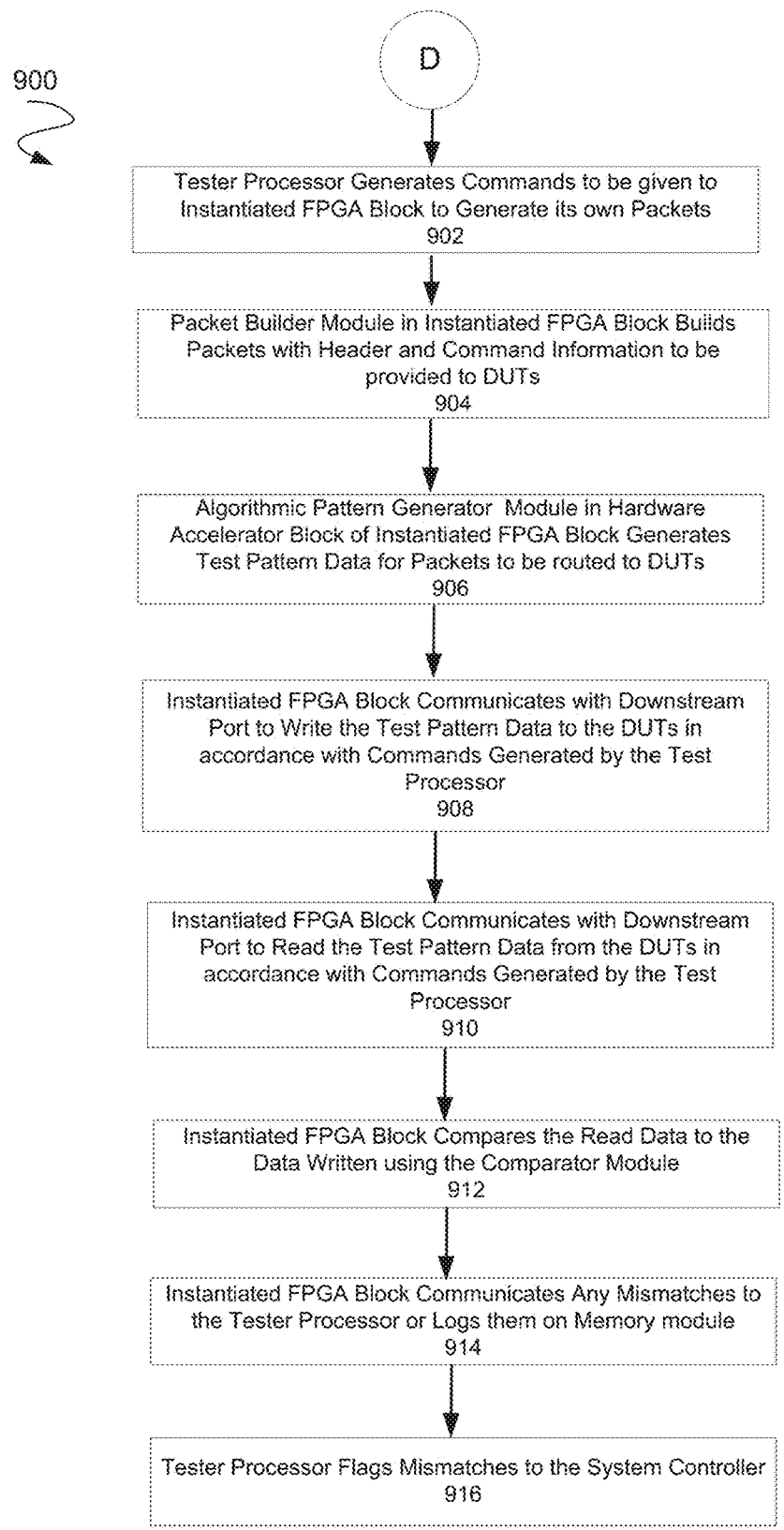
FIG. 9 is a continuation of FIG. 5 and is a flow chart of an exemplary method of testing DUTs in the hardware accelerator packet builder mode in one embodiment of the present invention.

FIG. 9 depicts a flowchart 900 of an exemplary process of testing DUTs in the hardware accelerator packet builder mode according to an embodiment of the present invention. The invention, however, is not limited to the description provided by flowchart 900. Rather, it will be apparent to persons skilled in the relevant art(s) from the teachings provided herein that other functional flows are within the scope and spirit of the present invention.

Flowchart 900 will be described with continued reference to exemplary embodiments described above in reference to FIGS. 2, 3 and 4, though the method is not limited to those embodiments Referring now to FIG. 9, a method of hardware acceleration is shown wherein the FPGA devices share both data and command generation functionality so as to relieve the processing load on the tester processor 304 and the data load on system buses 330 and 332. This mode is also known as "full acceleration" (FA) mode because most of the control for running the device tests is shifted to the FPGA devices and the tester processor 304 retains control for only commands other than reads and writes and compares.

At block 902 of the hardware accelerator packet builder mode, the tester processor 304 generates commands to be communicated to the instantiated FPGA block 410 to generate its own packets. The tester processor retains functionality for only the non read/write/compare commands in this mode. The functionality for commands such as read, write and compare operations are conveyed to the instantiated FPGA blocks. At block 904, the packet builder module 445 of the instantiated FPGA tester block builds packets with header and command information to be communicated to the DUTs. The packets comprise at least the command type, the block address of the device and the test pattern data.

The algorithmic pattern generator module 443 within the hardware accelerator block 440 generates the pseudo random test data to be written to the DUTs at block 906. The logic block module 450 comprises functionality for routing the data and commands generated by the instantiated FPGA block and consolidating them into packets to be written out to the DUTs.

At block 908, the instantiated FPGA tester block communicates with the downstream port 480 to route the test pattern data to the DUTs. The instantiated FPGA block 410, at step 910, communicates with the downstream port to read the test pattern data from the DUTs. The comparator module 446 of the hardware accelerator block 440 is then used to compare the read data to the data written to the DUTs at block 912. Any mismatches are either logged on memory module 420 or communicated by the instantiated FPGA block to the tester processor at block 914. The tester processor subsequently flags mismatches to the system controller at block 916 after receiving the error log.

FIG. 13 depicts a flowchart 1300 of an exemplary process of testing DUTs supporting non-standard sector sizes and protection modes according to an embodiment of the present invention. The invention, however, is not limited to the description provided by flowchart 1300. Rather, it will be apparent to persons skilled in the relevant art(s) from the teachings provided herein that other functional flows are within the scope and spirit of the present invention.

At block 1310, a host controller is coupled to a tester processor and an FPGA. The host controller may be a Windows based operation system as discussed above. Further, the tester processor may be running the Linux or a modified version of the Linux OS. The FPGA is communicatively coupled to the tester processor and is operable to generate commands and data for testing a plurality of DUTs in accordance with one of the various acceleration modes discussed above.

At block 1312, an acceleration mode is selected for generating commands and data for testing a plurality of connected DUTs. The acceleration mode may be a standard or bypass mode where the tester process generates all the commands and data and the FPGA is bypassed. Alternatively, the acceleration mode may be a PIDA, FA, or hardware accelerator memory mode as discussed above.

At block 1314, a number of sector sizes and protection modes to be tested for each of the connected plurality of DUTs is determined. For example, each SSD may have multiple odd sector sizes that it supports and needs to be tested for each of the sector sizes.

At block 1316, the commands and data for testing the plurality of DUTs for the supported sector sizes and protection modes is generated in accordance with the selected acceleration mode.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. An automated test equipment (ATE) apparatus comprising:
  a computer system comprising a system controller, wherein the system controller is communicatively coupled to a tester processor and an FPGA wherein the system controller is operable to transmit instructions to the tester processor, and wherein the tester processor is operable to generate commands and data from the instructions for coordinating testing of a device under test (DUT), wherein the DUT supports a plurality of non-standard sector sizes and a plurality of protection modes;
  the FPGA is communicatively coupled to the tester processor, wherein the FPGA comprises at least one hardware accelerator circuit operable to internally generate commands and data transparently from the tester processor for testing the DUT, and wherein the at least one hardware accelerator circuit is able to perform computations to calculate protection information associated with the plurality of protection modes and to generate repeatable test patterns sized to fit each of the plurality of non-standard sector sizes; and wherein the tester processor is configured to operate in one of a plurality of functional modes, wherein each functional mode is configured to allocate functionality for generating commands and for generating data between the tester processor and the FPGA in a different manner.

2. The apparatus of claim 1, wherein the system controller is operable to provide a graphical user interface (GUI) operable to allow a user to select one of the plurality of functional modes.

3. The apparatus of claim 1, wherein the system controller is operable to configure the tester processor and the FPGA to test the DUT for each of the plurality of protection modes and each of the plurality of non-standard sector sizes.

4. The apparatus of claim 1 wherein the functional modes comprise four functional modes comprising a bypass mode, the hardware accelerator pattern generator mode, a hardware accelerator memory mode and a hardware accelerator packet builder mode.

5. The apparatus of claim 4 wherein, in the bypass mode, the tester processor is configured to generate all commands and data for coordinating testing of the DUT, and wherein the data comprises the protection information associated with the plurality of protection modes and sector data to fit each of the plurality of non-standard sector sizes.

6. The apparatus of claim 5 wherein, in the hardware accelerator pattern generator mode: the tester processor is configured to generate all commands for coordinating testing of the DUT; and the at least one hardware accelerator circuit of the FPGA generates test pattern data, wherein the test pattern data comprises the protection information associated with the plurality of protection modes and sector data to fit each of the plurality of non-standard sector sizes.

7. The apparatus of claim 5 wherein, in the hardware accelerator memory mode: the tester processor is configured to generate all commands for coordinating testing of the DUT; and the at least one hardware accelerator circuit of the FPGA performs a step selected from the group comprising: read the test pattern data from the memory device, write the test pattern data to the DUT and compare the data read from the DUT, wherein the test pattern data stored in the memory device comprises the protection information associated with the plurality of protection modes and sector data to fit each of the plurality of non-standard sector sizes.

8. The apparatus of claim 5 wherein, in the hardware accelerator packet builder mode, the at least one hardware accelerator circuit of the FPGA is configured to generate both test data and command data for coordinating testing of the DUT wherein the test pattern data comprises the protection information associated with the plurality of protection modes and sector data to fit each of the plurality of non-standard sector sizes.

9. The apparatus of claim 1, wherein the system controller is operable to execute a Windows operating system.

10. The apparatus of claim 1, wherein the tester processor is configured to execute a Linux operating system.

11. The apparatus of claim 1, wherein the FPGA comprises an IP core, wherein the IP core is operable to be programmed to emulate a protocol, wherein the protocol is selected from a group consisting of: SATA or SAS.

12. The apparatus of claim 11, wherein the IP core is operable to be re-programmed to emulate a different protocol.

13. The apparatus of claim 1, wherein the DUT is a solid state device (SSD).

14. The apparatus of claim 13, wherein the plurality of non-standard sector sizes can be selected from a group consisting of: 520+0, 4104+0, 528+0, and 4224+0.

15. The apparatus of claim 13, wherein the plurality of protection modes can be selected from a group consisting of: 512+8 and 4096+8.

16. A method for testing using an automated test equipment (ATE) comprising:
transmitting instructions from a system controller of a computer system to a tester processor, wherein the system controller is communicatively coupled to a the tester processor and an FPGA, wherein the tester processor is operable to generate commands and data from the instructions for coordinating testing of a plurality of DUTs, wherein each of the plurality of DUTs supports a plurality of non-standard sector sizes and a plurality of protection modes;
generating commands and data transparently from the tester processor for testing of a plurality of DUTs using a hardware accelerator circuit programmed within an FPGA, wherein the FPGA is communicatively coupled to the tester processor and wherein the hardware accelerator circuit is operable to test the plurality of DUTs, and wherein the hardware accelerator circuit is able to perform computations to calculate protection information associated with the plurality of protection modes and to generate repeatable test patterns sized to fit each of the plurality of non-standard sector sizes; and
operating the tester processor in one of a plurality of functional modes, wherein each functional mode is configured to allocate functionality for generating commands and for generating data between the tester processor and the FPGA in a different manner.

17. The method of claim 16 wherein the functional modes comprise four functional modes comprising a bypass mode, the hardware accelerator pattern generator mode, a hardware accelerator memory mode and a hardware accelerator packet builder mode.

18. The method of claim 17 wherein the bypass mode further comprises generating all commands and data for coordinating testing of the plurality of DUTs using the tester processor and wherein the data generated by the tester processor in bypass mode comprises the protection information associated with the plurality of protection modes and sector data to fit each of the plurality of non-standard sector sizes.

19. The method of claim 17 wherein the hardware accelerator pattern generator mode comprises: generating all commands for coordinating testing of the plurality of DUTs using the tester processor; and using the hardware accelerator circuit to perform a step selected from the group comprising: generating all test pattern data, writing the test pattern data and comparing the test pattern data read from the plurality of DUTs, wherein the test pattern data comprises the protection information associated with the plurality of protection modes and sector data to fit each of the plurality of non-standard sector sizes.

20. The method of claim 17, wherein, the hardware accelerator memory mode comprises: generating all commands for coordinating testing of the plurality of DUTs using the tester processor; and using the hardware accelerator circuit to perform a step selected from the group comprising: reading test pattern data from the memory device, writing the test pattern data to the plurality of DUTs, and comparing the data read from the plurality of DUTs, wherein the test pattern data in the memory device comprises the protection information associated with the plurality of protection modes and sector data to fit each of the plurality of non-standard sector sizes.

21. The method of claim 17, wherein the hardware accelerator packet builder mode comprises generating all commands and data for coordinating testing of the one or two DUTs using the hardware accelerator circuit, wherein the test pattern data comprises the protection information associated with the plurality of protection modes and sector data to fit each of the plurality of non-standard sector sizes.

22. A tester comprising:
   a system controller for controlling a test program for testing a plurality of DUTs, wherein each of the plurality of DUTs support a plurality of non-standard sector sizes and a plurality of protection modes;
   a primitive comprising a plurality of tester slices, wherein each tester slice comprises a tester processor coupled to communicate with the system controller to receive instructions and data therefrom in accordance with the test program and at least one programmable instantiated tester block coupled to the tester processor, wherein the at least one programmable instantiated tester block is operable to generate test data for application to the plurality of DUTs in a way transparent to the test processor, further operable to receive and compare test data generated by the plurality of DUTs in a way transparent to the tester processor, and further yet operable to be programmed to communicate with the plurality of DUTs in a communication or storage protocol compatible with the plurality of DUTs, and wherein the at least one programmable instantiated tester block comprises a hardware accelerator circuit operable to perform computations to calculate protection information associated with the plurality of protection modes and to generate repeatable test patterns sized to fit each of the plurality of non-standard sector sizes;
   a local memory coupled to the programmable instantiated tester block for storing test data therein; and
   a device interface board for coupling the plurality of tester slices to the plurality of DUTs;
   wherein each programmable instantiated tester block is operable in one of a plurality of functional modes, wherein each functional mode is configured to allocate functionality for generating commands and for generating data between the tester processor and the programmable instantiated tester block in a different manner.

23. The tester of claim 22, wherein the programmable instantiated tester block is implemented within a Field Programmable Gate Array (FPGA) device.

* * * * *